(12) United States Patent
Koyama et al.

(10) Patent No.: US 7,946,503 B2
(45) Date of Patent: May 24, 2011

(54) SEMICONDUCTOR DEVICE

(75) Inventors: Jun Koyama, Sagamihara (JP); Keitaro Imai, Yokohama (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/510,494

(22) Filed: Jul. 28, 2009

(65) Prior Publication Data

US 2009/0284310 A1 Nov. 19, 2009

Related U.S. Application Data

(62) Division of application No. 11/044,828, filed on Jan. 28, 2005, now Pat. No. 7,699,232.

(30) Foreign Application Priority Data

Feb. 6, 2004 (JP) ................................. 2004-030681

(51) Int. Cl.
*G06K 19/06* (2006.01)
(52) U.S. Cl. ...................... 235/492; 235/380; 365/225.7; 365/96; 365/200
(58) Field of Classification Search .................. 235/492; 365/225.7, 96, 200
See application file for complete search history.

(56) References Cited

U.S. PATENT DOCUMENTS

| | | | |
|---|---|---|---|
| 4,922,319 A | 5/1990 | Fukushima | |
| 5,214,409 A | 5/1993 | Beigel | |
| 5,257,011 A | 10/1993 | Beigel | |
| 5,499,017 A | 3/1996 | Beigel | |
| 5,523,974 A | 6/1996 | Hirano et al. | |
| 5,525,991 A | 6/1996 | Nagura et al. | |
| 5,532,181 A | 7/1996 | Takebuchi et al. | |
| 5,625,219 A | 4/1997 | Takagi | |
| 5,732,401 A | 3/1998 | Conway | |
| 5,736,728 A | 4/1998 | Matsubara | |
| 5,999,445 A | 12/1999 | Rolandi et al. | |
| 6,070,804 A | 6/2000 | Miyamoto | |
| 6,079,622 A | 6/2000 | Goto | |
| 6,190,951 B1 | 2/2001 | Nakahori et al. | |

(Continued)

FOREIGN PATENT DOCUMENTS

CN 1166048 11/1997

(Continued)

OTHER PUBLICATIONS

Office Action (Application No. 200510007878.9) dated Jul. 10, 2009.

*Primary Examiner* — Michael G Lee
*Assistant Examiner* — Kristy A Haupt
(74) *Attorney, Agent, or Firm* — Eric J. Robinson; Robinson Intellectual Property Law Office, P.C.

(57) ABSTRACT

A semiconductor device which may be used as an ID chip and data may be rewritten only one time. In addition, a semiconductor device may be used as an ID chip and data may be written except when manufacturing the chip. The invention has a modulating circuit, a demodulating circuit, a logic circuit, a memory circuit, and an antenna circuit over an insulating substrate. The modulating circuit and the demodulating circuit are electrically connected to an antenna circuit, the demodulating circuit is connected to the logic circuit, the memory circuit stores an output signal of the logic circuit, and the memory circuit is a fuse memory circuit using a fuse element.

19 Claims, 29 Drawing Sheets

U.S. PATENT DOCUMENTS

| | | |
|---|---|---|
| 6,330,204 B1 | 12/2001 | Miyagi |
| 6,483,745 B2 | 11/2002 | Saeki |
| 6,509,217 B1 | 1/2003 | Reddy |
| 6,509,602 B2 | 1/2003 | Yamazaki et al. |
| 6,525,595 B2 | 2/2003 | Oku |
| 6,567,313 B2 | 5/2003 | Tanaka et al. |
| 6,768,680 B2 | 7/2004 | Kato |
| 6,787,806 B1 | 9/2004 | Yamazaki et al. |
| 6,809,952 B2 | 10/2004 | Masui |
| 6,954,084 B2 | 10/2005 | Islam |
| 6,972,662 B1 | 12/2005 | Ohkawa et al. |
| 7,031,946 B1 | 4/2006 | Tamai et al. |
| 7,121,472 B2 | 10/2006 | Shimizu et al. |
| 7,172,929 B2 | 2/2007 | Yamazaki et al. |
| 7,275,696 B2 | 10/2007 | Akita et al. |
| 7,335,573 B2 | 2/2008 | Takayama et al. |
| 7,699,232 B2 * | 4/2010 | Koyama et al. ............... 235/492 |
| 2002/0113268 A1 | 8/2002 | Koyama et al. |
| 2004/0164302 A1 | 8/2004 | Arai et al. |
| 2005/0130389 A1 | 6/2005 | Yamazaki et al. |
| 2005/0157529 A1 | 7/2005 | Iwata et al. |
| 2005/0170270 A1 | 8/2005 | Funaki et al. |
| 2005/0180187 A1 | 8/2005 | Koyama |
| 2007/0171693 A1 | 7/2007 | Koyama |
| 2007/0252206 A1 | 11/2007 | Yamazaki et al. |

FOREIGN PATENT DOCUMENTS

| | | |
|---|---|---|
| JP | 62-172739 | 7/1987 |
| JP | 04-307757 | 10/1992 |
| JP | 05-129920 | 5/1993 |
| JP | 06-302775 | 10/1994 |
| JP | 11-020360 | 1/1999 |
| JP | 11-073481 | 3/1999 |
| JP | 11-297963 | 10/1999 |
| JP | 2000-020665 | 1/2000 |
| JP | 2000-242754 | 9/2000 |
| JP | 2000-293996 | 10/2000 |
| JP | 2001-250393 | 9/2001 |
| JP | 2001-291079 | 10/2001 |

* cited by examiner

1100 : upper substrate
1101 : antenna wiring

3000: insulating substrate
3001: base layer
3025: second interlayer insulatin film 4000: peeling layer
4001: third interlayer insulatin film
4002~4005: pad 4006: protective layer
4007: trench

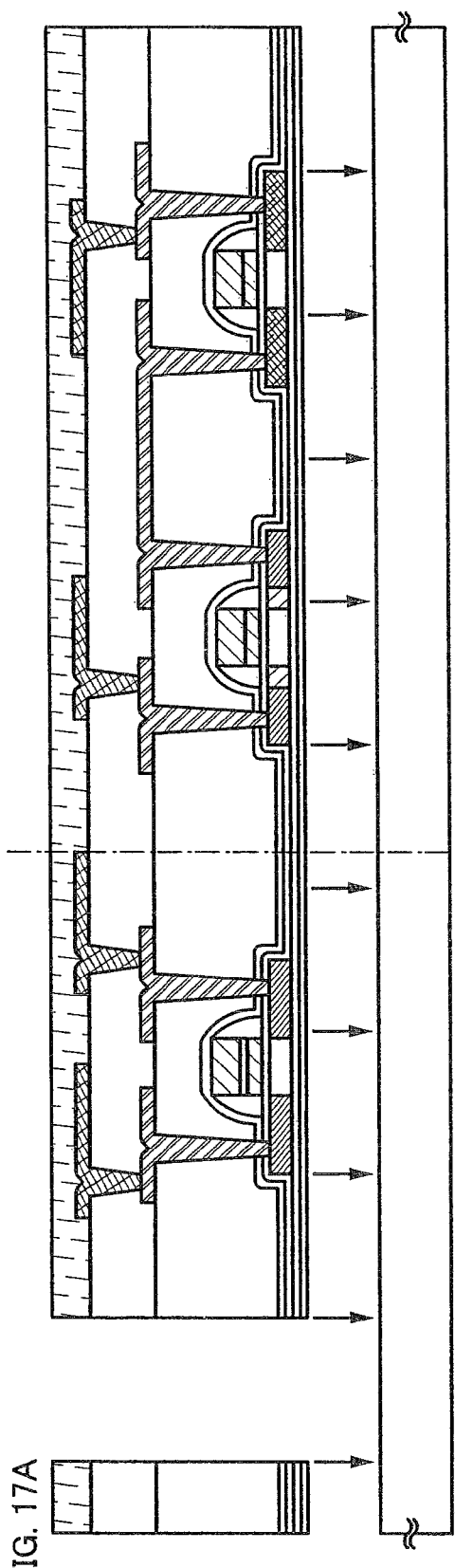
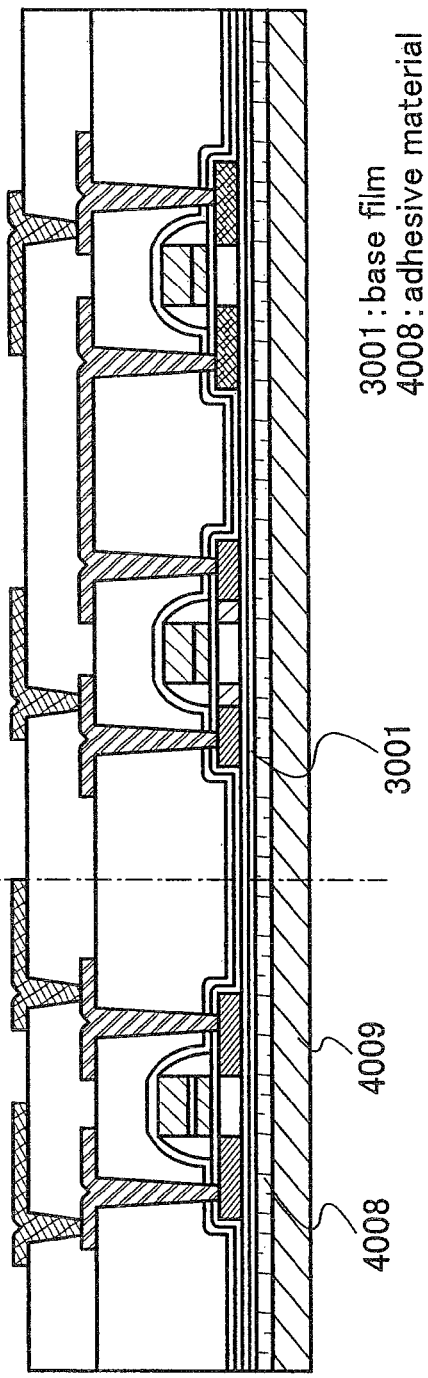

FIG. 22A forming peeling layer\protective layre
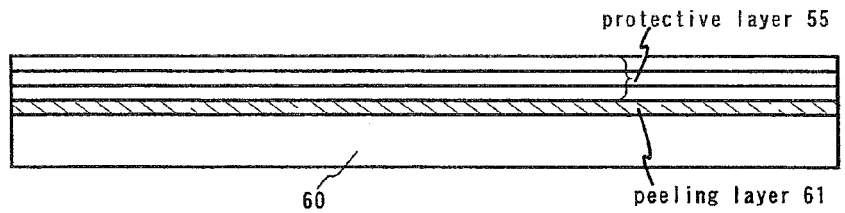
FIG. 22B forming island-shaped semiconductor film\gate insulating film
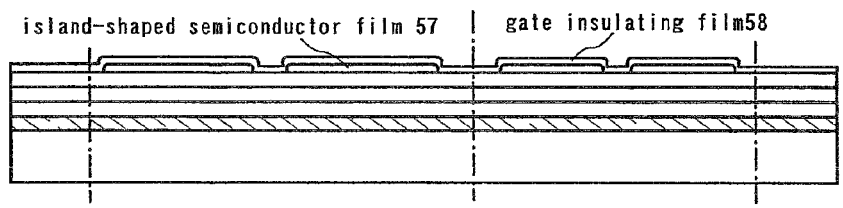
FIG. 22C forming gate electrode
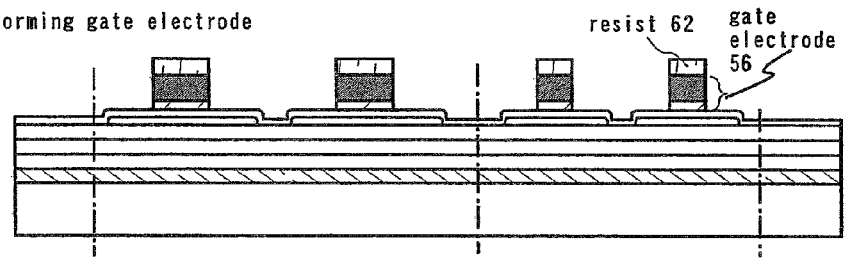
FIG. 22D light doping N-type impurity at a low concentration
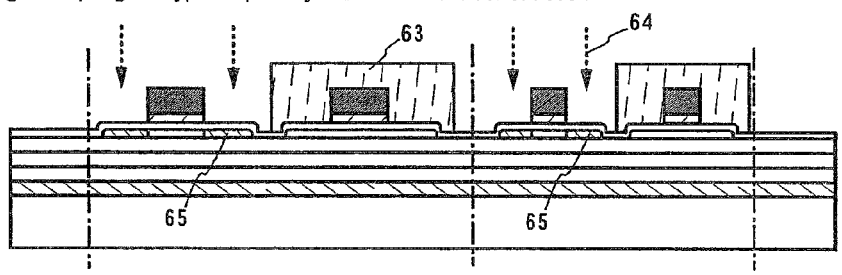
FIG. 22E heavy doping P-type impurity at a high concentration
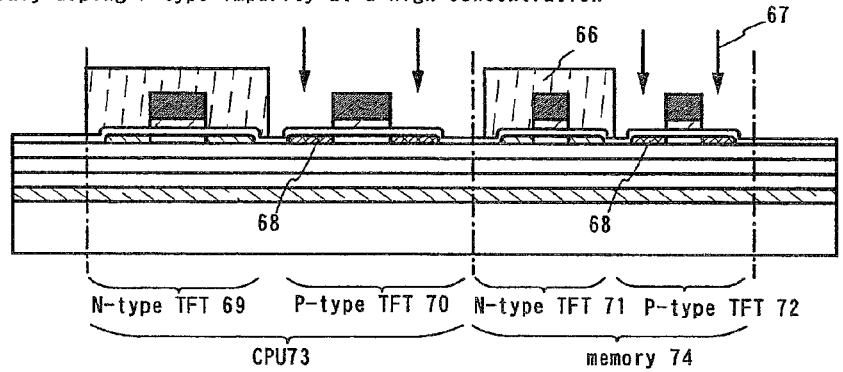

FIG. 23F forming insulating film
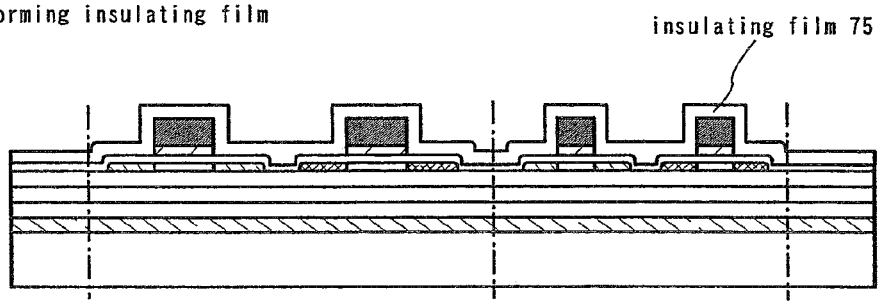
FIG. 23G etch-back (forming sidewall)
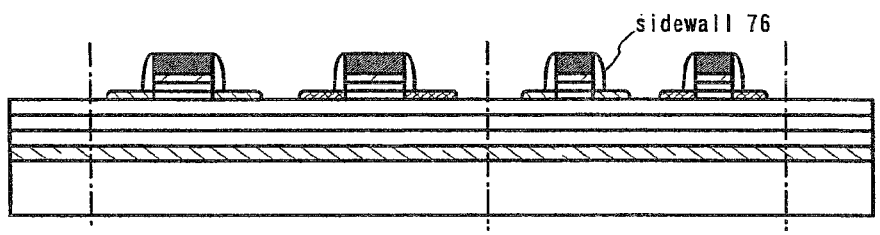
FIG. 23H heavy doping N-type impurity at a high concentration
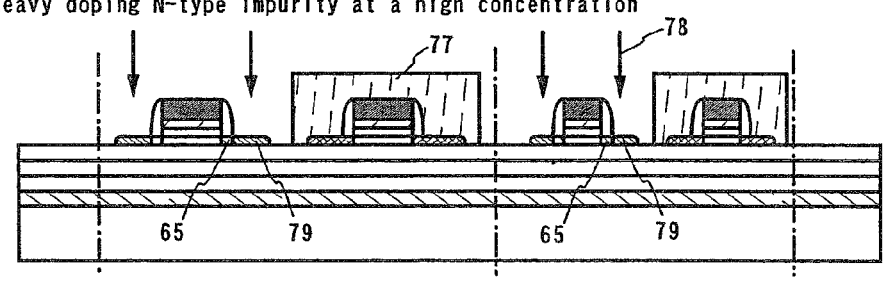
FIG. 23I forming interlayer film\protective film\wiring
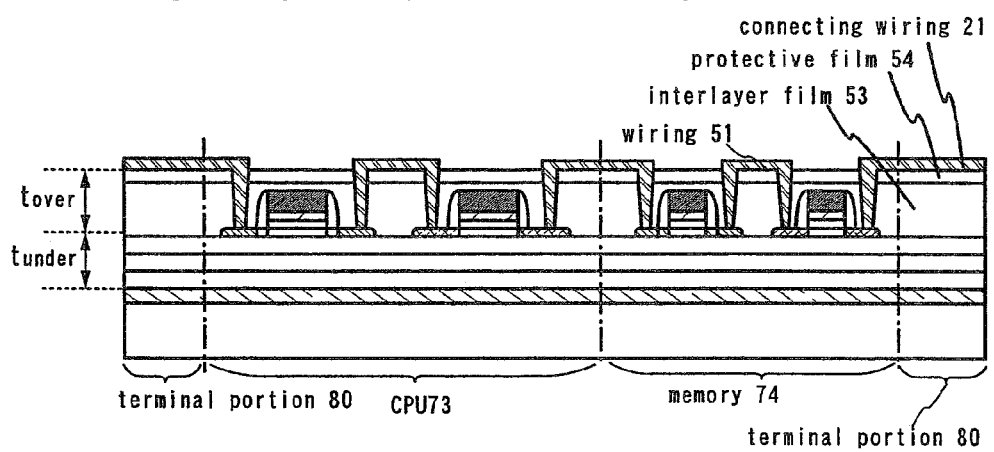

bag 2501

ID chip 2502

SEMICONDUCTOR DEVICE

BACKGROUND OF THE INVENTION

1. Field of the Invention

The present invention relates to a semiconductor device used as an IC chip (hereafter also referred to as an 'ID chip') in which required data can be stored in a memory circuit or from which data can be read by a non-contact means such as wireless communication. In particular, the invention relates to a semiconductor device used as an ID chip formed over an insulating substrate such as glass and plastic.

2. Description of the Related Art

As a computer technology and an image recognition technology advance, data recognition by using a medium such as a barcode is widely used for recognition of merchandise data and the like. It is expected that more amount of data recognition will be required in the future. On the other hand, when reading data with a barcode, there are such disadvantages that a barcode reader has to touch the barcode for reading and a barcode cannot store much data. Therefore, data recognition without contact and increase in storage capacity of a medium are demanded.

In response to such demands, an ID chip using an IC is developed in recent years. An ID chip stores required data in a memory circuit within an IC chip and the data is read out by using a non-contact means that is generally a wireless means. It is expected that commercial distribution and the like become simpler, cost is reduced, and high security is achieved by translating such an ID chip into a practical use.

An overview of an individual identification system using an ID chip is described using FIG. 4. FIG. 4 illustrates an overview of an individual identification system for obtaining individual data of a bag without contact. An ID chip 401 storing particular individual data is attached to or embedded in a bag 404. A radio wave is transmitted from an antenna unit 402 of an interrogator (also referred to as a reader/writer) 403 to the ID chip 401. When receiving the radio wave, the ID chip 401 sends in return the individual data thereof to the antenna unit 402. The antenna unit 402 sends the individual data to the interrogator 403 to identify it. In this manner, the interrogator 403 can obtain data of the bag 404. Furthermore, this system enables physical distribution management, counting, exclusion of a counterfeit, and the like.

FIG. 2 shows an example of such an ID chip technology. A semiconductor device 200 used as an ID chip includes an antenna circuit 201, a rectifier circuit 202, a stabilizing power source circuit 203, an amplifier 208, a demodulating circuit 213, a logic circuit 209, a memory control circuit 212, a memory circuit 211, a logic circuit 207, an amplifier 206, and a modulating circuit 205. Further, the antenna circuit 201 includes an antenna coil 301 and a tuning capacitor 302 (FIG. 3A). The rectifier circuit 202 includes diodes 303 and 304 and a smoothing capacitor 305 (FIG. 3B).

An operation of such an ID chip is described now. An alternating signal received by the antenna circuit 201 is processed with a half-wave rectification by the diodes 303 and 304 and smoothed by the smoothing capacitor 305. This smoothed voltage has a number of ripples, therefore, it is stabilized by the stabilizing power source circuit 203 and the stabilized voltage is supplied to the demodulating circuit 213, the amplifier 206, the logic circuit 207, the amplifier 208, the logic circuit 209, the memory circuit 211, and the memory control circuit 212. On the other hand, a signal received by the antenna circuit 201 is input to the logic circuit 209 through the amplifier 208 as a clock signal. In addition, a signal input by an antenna is demodulated by the demodulating circuit 213, and input to the logic circuit 209 as data.

In the logic circuit 209, the input data is decoded. An interrogator sends data being encoded with a deformation mirror code, an NRZ-L code, or the like and it is decoded by the logic circuit 209. The decoded data is sent to the memory control circuit 212, thereby stored data in the memory circuit 211 is read out. It is necessary that the memory circuit 211 is a nonvolatile memory circuit which is capable of storing even when the power is OFF, and a masked ROM or the like is employed. The stored content is, for example, 16-byte data (see FIG. 12A) which includes a 4-byte family code, a 4-byte application code, and two kinds of 4-byte user codes set by a user, which indicates a line of the ID chip.

As for a transmitted/received signal, 125 kHz, 13.56 MHz, 915 MHz, 2.45 GHz or the like may be employed, to which the ISO standard or the like is applied. In addition, modulation and demodulation systems in transmission/reception are standardized. Patent Document 1 is an example of such an ID chip.

[Patent Document 1]

Japanese Patent Laid-Open No. 2001-250393

SUMMARY OF THE INVENTION

A conventional semiconductor device for an ID chip as described above has the following problem. In the case where a masked ROM is employed as a memory circuit, it is not capable of written data except when manufacturing the chip. Thus, an ID chip which is capable of being written data except when manufacturing the chip is requested. Alternatively, in the case where an EEPROM is employed as a memory circuit, the content thereof can be rewritten by a user at will, though someone except a real user can rewrite the data for identification whose rewrite is forbidden, thereby forgery is possible. Therefore, in order to prevent such a forgery, an ID chip which is capable of being written data only one time is requested.

In view of the heretofore, the invention provides a semiconductor device which is used as an ID chip and capable of being written data only one time. In addition, the invention provides a semiconductor device used as an ID chip which is capable of being written data except when manufacturing the chip.

The invention comprises a modulating circuit, a demodulating circuit, a logic circuit, and a memory circuit over an insulating substrate. The modulating circuit and the demodulating circuit are electrically connected to an antenna circuit, the demodulating circuit is connected to the logic circuit, the memory circuit stores an output signal of the logic circuit, and the memory circuit is a fuse memory circuit using a fuse element.

In the semiconductor device, the fuse memory circuit comprises a control circuit which is capable of being written data only one time.

The invention comprises a modulating circuit, a demodulating circuit, a logic circuit, and a memory circuit over an insulating substrate. The modulating circuit and the demodulating circuit are electrically connected to an antenna circuit, the demodulating circuit is connected to the logic circuit, the memory circuit stores an output signal of the logic circuit, the memory circuit is a fuse memory circuit using a fuse element, and the logic circuit controls whether writing of the memory circuit is possible or not depending on data stored in the memory circuit.

In the semiconductor device, the fuse element configuring the fuse memory circuit carries out a storage operation by blowing a metal wiring.

In the semiconductor device, the fuse element configuring the fuse memory circuit carries out a storage operation by blowing a semiconductor thin film.

In the semiconductor device, the fuse element configuring the fuse memory circuit carries out a storage operation by short-circuiting an insulating film.

In the semiconductor device, power for the case where the fuse memory circuit carries out a storage operation is obtained by rectifying a signal output from the antenna circuit and by boosting voltage thereof.

In the semiconductor device, power for the case where the fuse memory circuit carries out a storage operation is obtained with an external high voltage power source.

In the semiconductor device, at least one of the modulating circuit, the demodulating circuit, the logic circuit, and the memory circuit is configured by a thin film transistor (also referred to as a 'TFT' hereafter).

In the semiconductor device, the antenna circuit, the modulating circuit, the demodulating circuit, the logic circuit, and the memory circuit are integrally formed over the same insulating substrate, or the modulating circuit, the demodulating circuit, the logic circuit, and the memory circuit are integrally formed over the same insulating substrate and the antenna circuit is formed over another insulating substrate.

In the semiconductor device, the insulating substrate is the one selected among glass, plastic, and a film insulator.

In the semiconductor device, the antenna circuit is formed over at least one of the modulating circuit, the demodulating circuit, the logic circuit, and the memory circuit.

In the semiconductor device, a signal input to the antenna circuit is a radio frequency signal.

In the invention, an ID chip refers to a semiconductor chip used for individual identification, which is used for an IC tag, a wireless tag, an RFID, an IC card, a transponder, and the like.

As described hereinbefore, according to the invention, data can be written only one time to a memory circuit in an ID chip. In this manner, data forgery of the ID chip can be prevented, thereby a semiconductor device used as a security-protected ID chip can be manufactured. In addition, it is possible to provide a semiconductor device used as an ID chip which is capable of being written data except when manufacturing the chip.

BRIEF DESCRIPTION OF THE DRAWINGS

FIGS. 17A and 17B are cross-sectional views each at a step of the invention.

FIGS. 22A to 22E are cross-sectional views each at a step of the invention.

FIGS. 23F to 23I are cross-sectional views each at a step of the invention.

DETAILED DESCRIPTION OF THE INVENTION

Figure 1:
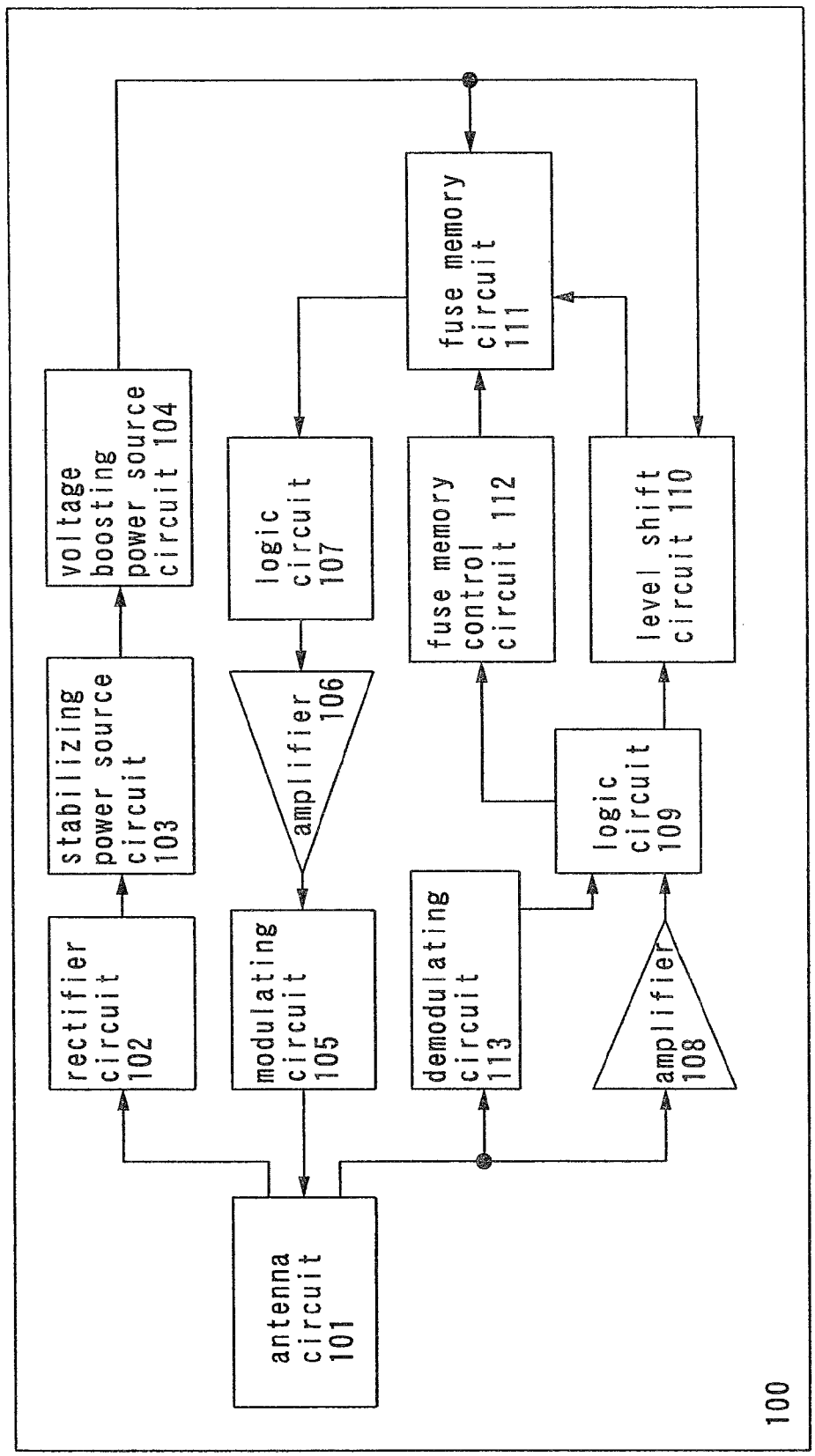
FIG. 1 is a block diagram showing a constitution of a semiconductor device of the invention.
Figure 2:
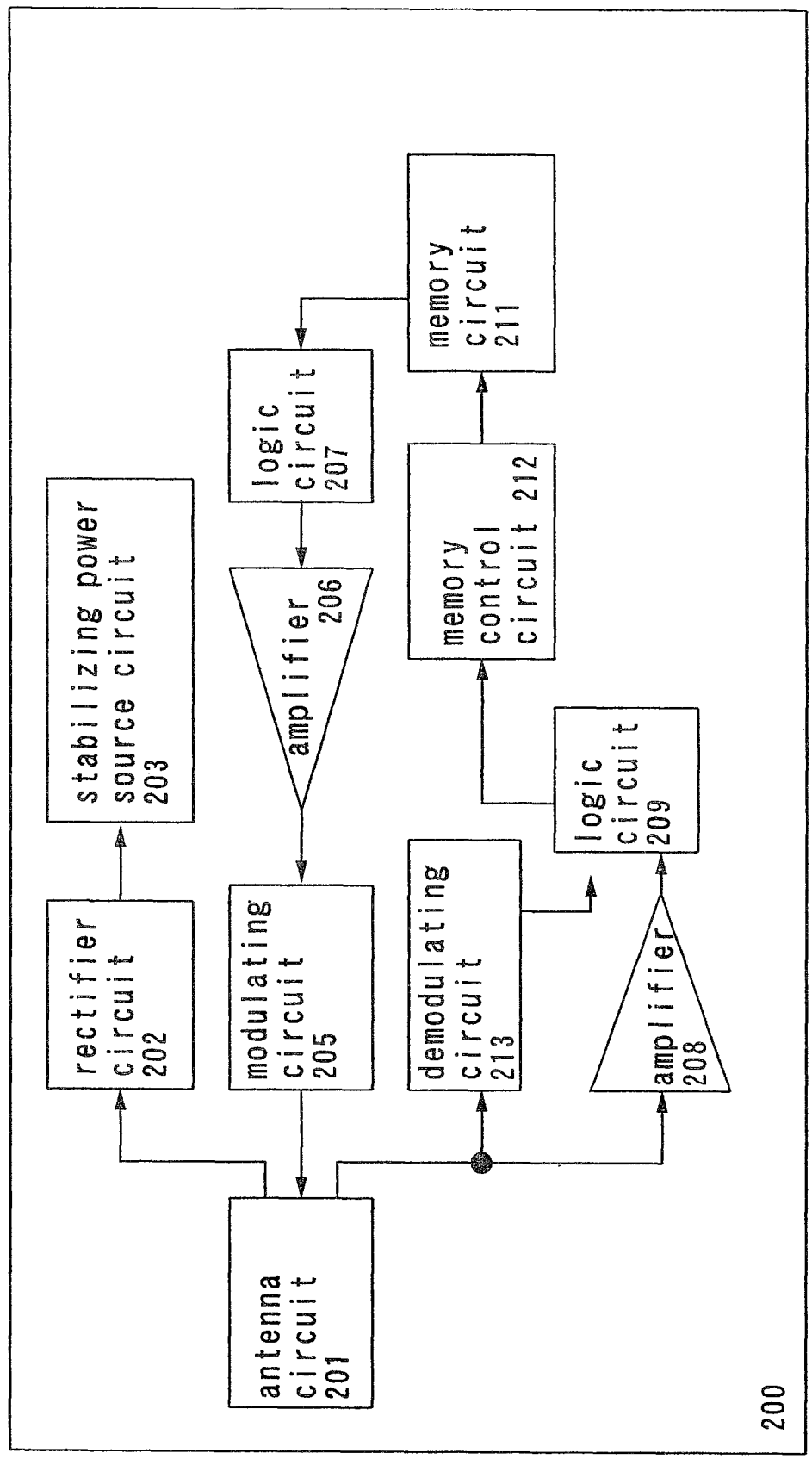
FIG. 2 is a block diagram showing a constitution of a conventional semiconductor device.

Although the invention will be fully described by way of example with reference to the accompanying drawings, it is to be understood that various changes and modifications will be apparent to those skilled in the art. Therefore, unless such changes and modifications depart from the scope of the invention, they should be construed as being included therein. Note that identical portions in embodiment modes are denoted by the same reference numerals and detailed descriptions thereof are omitted.

Figure 3A:
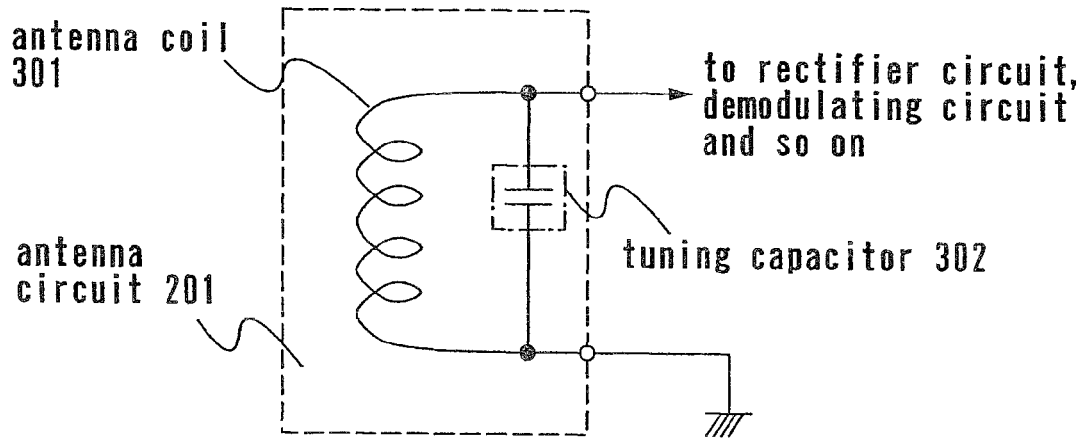
FIGS. 3A and 3B are block diagrams each showing a configuration of a conventional semiconductor device.
Figure 3B:
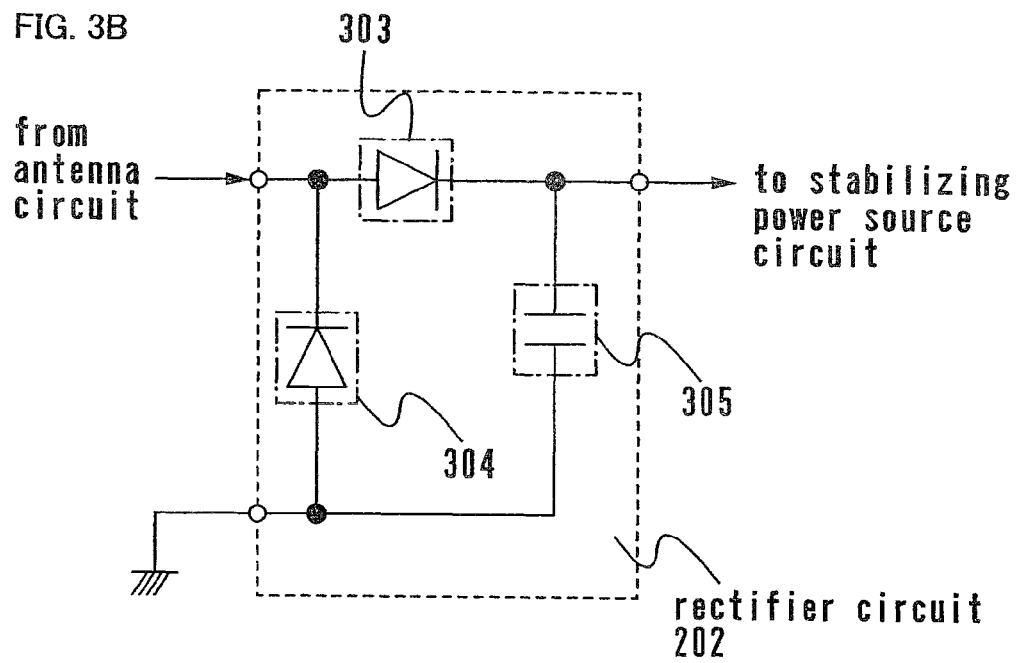
Figure 4:
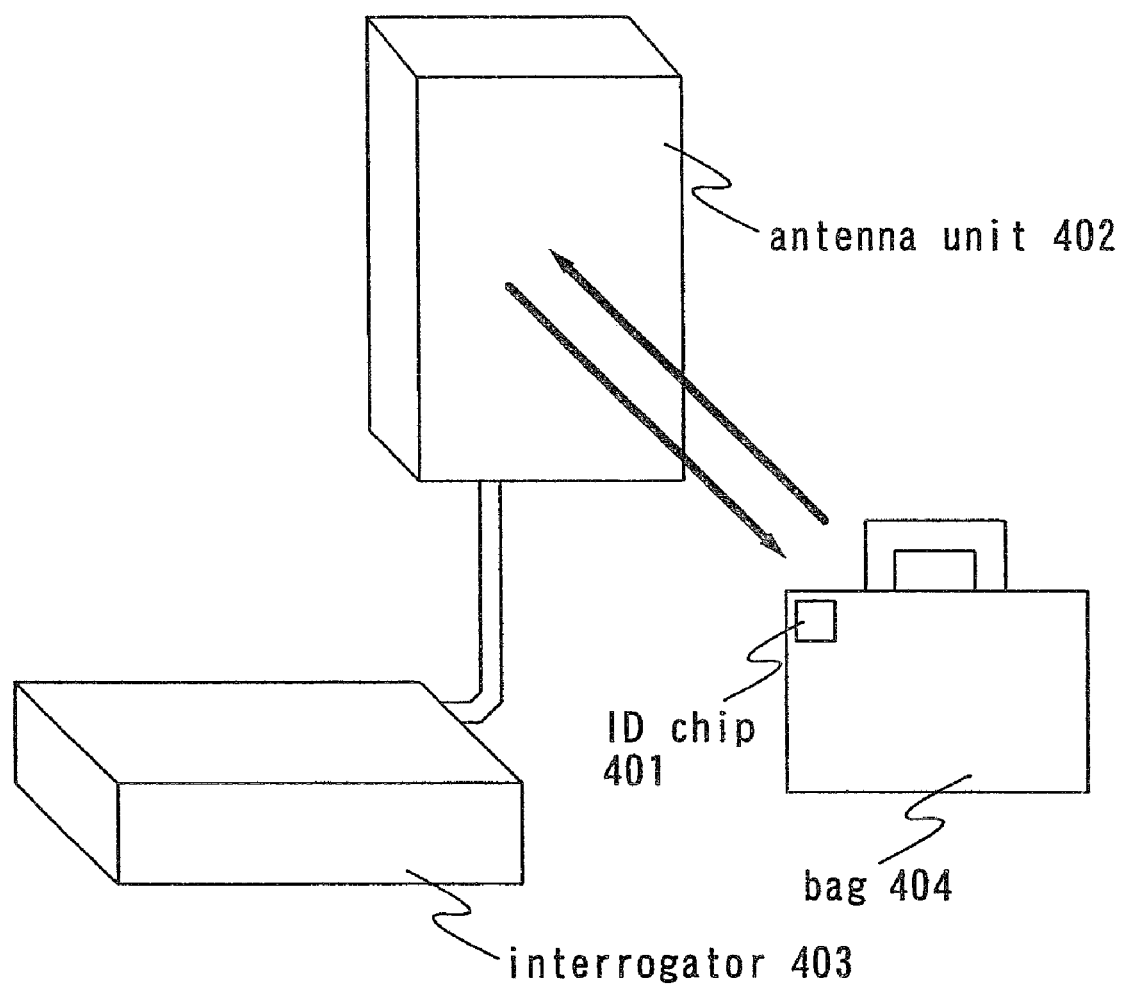
FIG. 4 is a diagram showing an overview of an RF tag system.

A semiconductor device 100 used as an ID chip includes an antenna circuit 101, a rectifier circuit 102, a stabilizing power source circuit 103, a voltage boosting power source circuit 104, a modulating circuit 105, an amplifier 106, a logic circuit 107, an amplifier 108, a logic circuit 109, a level shift circuit 110, a fuse memory circuit 111, a fuse memory control circuit 112, and a demodulating circuit 113 (see FIG. 1). The antenna circuit 101 is similar to the conventional one shown in FIG. 3A. The rectifier circuit 102 is also similar to the conventional one shown FIG. 3B. In this embodiment mode, the antenna circuit 101 is formed over the semiconductor device 100, though the invention is not limited to this and the antenna circuit 101 may be connected to outside of the semiconductor device 100.

An operation of such an ID chip is described now. An alternating signal received by the antenna circuit 101 is processed with a half-wave rectification and smoothed by the rectifier circuit 102. This smoothed voltage has a number of ripples, therefore, it is stabilized by the stabilizing power source circuit 103 and the stabilized voltage is supplied to the voltage boosting power source circuit 104, the amplifier 106, the logic circuit 107, the amplifier 108, and the logic circuit 109.

In the case of writing data to the fuse memory circuit 111, output voltage of the stabilizing power source circuit 103 is boosted by the voltage boosting power source circuit 104 and the boosted voltage is used to write data to the fuse memory circuit 111. A charge-pump circuit or the like is employed as the voltage boosting power source circuit 104, though the invention is not limited to this. As for a clock signal for operating the voltage boosting power source circuit 104, it may be generated using an alternating signal input from the antenna circuit 101, or may be generated using an oscillating circuit provided additionally in the semiconductor device 100.

A signal input from the antenna circuit 101 is logically operated in the logic circuit 109 to be input to the level shift circuit 110. The level shift circuit 110 operates with voltage boosted by the voltage boosting power source circuit 104 and amplifies the signal amplitude of the logic circuit 109. The logic circuit 109 specifies whether to write or not, an address, or the like for the fuse memory control circuit 112. The fuse memory circuit 111 is carried out data writing in accordance with a command from the fuse memory control circuit 112 and the level shift circuit 110.

An interrogator calls out the data stored in the fuse memory circuit 111 by the following operation. An alternating signal received by the antenna circuit 101 is processed with a half-wave rectification and smoothed by the rectifier circuit 102. This smoothed voltage has a number of ripples, therefore, it is stabilized by the stabilizing power source circuit 103 to be supplied to the voltage boosting power source circuit 104, the amplifier 106, the logic circuit 107, the amplifier 108, and the logic circuit 109. On the other hand, an alternating signal received by the antenna circuit 101 is input to the logic circuit 109 through the amplifier 108, thereby logically operated. Subsequently, the signal of the logic circuit 109 controls the fuse memory control circuit 112 to call out the data stored in the fuse memory circuit 111. The data of the fuse memory circuit 111 is processed by the logic circuit 107, and an output thereof operates the modulating circuit 105. The data processing is carried out in accordance with a bog-standard system such as ISO14443, ISO15693, and ISO18000, though other processing system than these standards can be adopted as long as it matches to the interrogator.

When the modulating circuit 105 operates, impedance of the antenna circuit 101 is changed. Accordingly, a signal of the interrogator which is reflected on the antenna circuit 101 changes. When the interrogator reads this change, data stored in the fuse memory circuit 111 of the semiconductor device 100 can be recognized. Such a modulation system is referred to as a load modulation system.

An operation of a fuse memory circuit is described below using FIG. 5. The fuse memory circuit shown in FIG. 5 is a 6-bit memory circuit for simplification, though the invention is not limited to a 6-bit.

Figure 5:
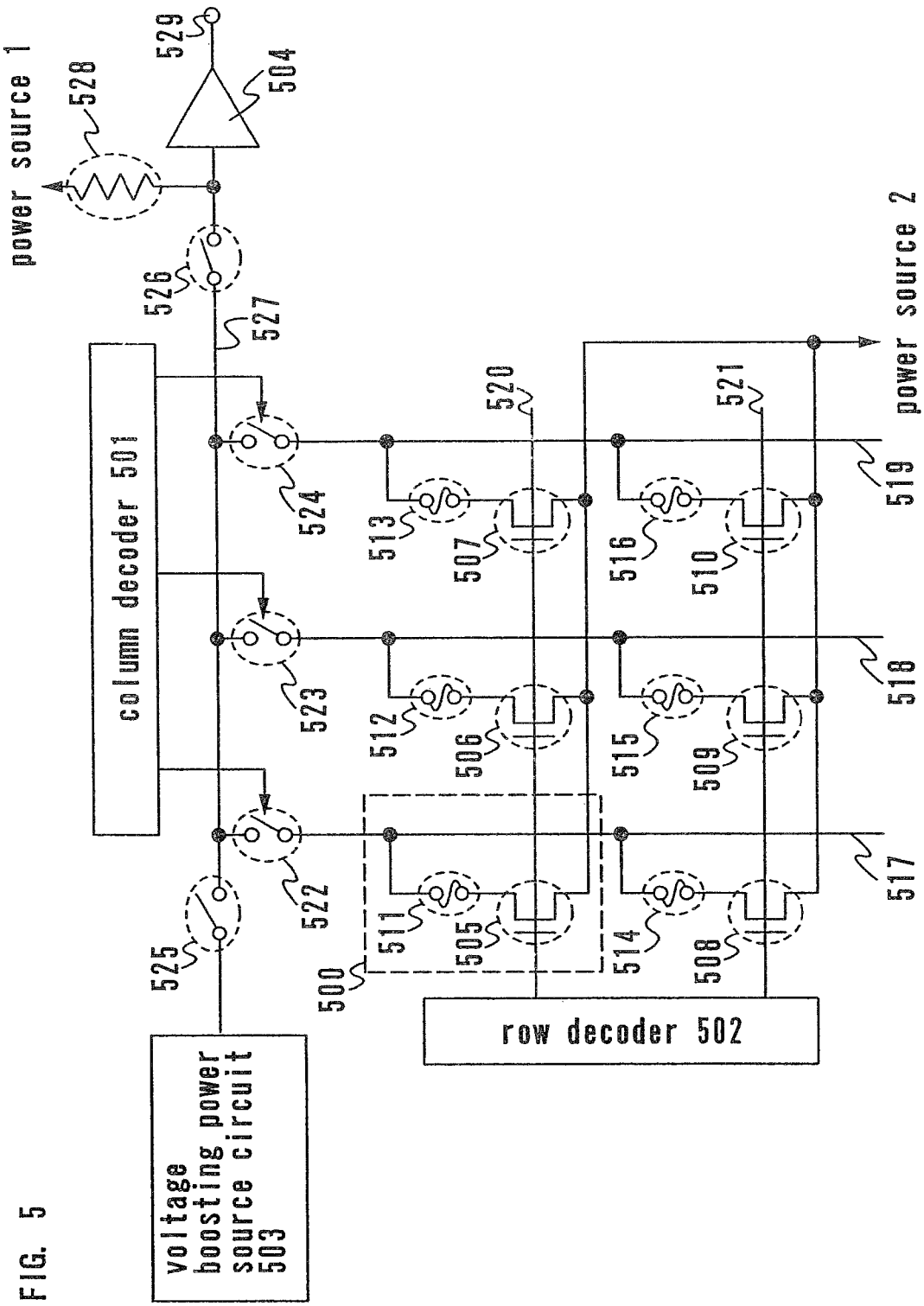
FIG. 5 is a diagram showing a circuit configuration of a fuse memory.

The fuse memory circuit includes a column decoder 501, a row decoder 502, a voltage boosting power source circuit 503, an amplifier 504, N-type transistors 505 to 510, fuse elements 511 to 516, bit lines 517 to 519, word lines 520 and 521, column switches 552 to 524, switches 525 and 526, an output wiring 527, a memory load resistor 528, an output terminal 529, a power source 1, and a power source 2 (FIG. 5). The power source 1 serves to set Hi potential while the power source 2 serves to set Lo potential. Note that in the case where the transistors 505 to 510 are P-type transistors, the power source 1 serves to set Lo potential while the power source 2 serves to set Hi potential. In the description below, the transistors 505 to 510 are N-type transistors.

Description is made on a memory cell 500 including the transistor 505 and the fuse element 511 as an example.

First, the case of reading out data at the initial stage is described. The fuse elements 511 to 516 serve as electric wirings at the initial stage, thereby the transistors 505 and 508 are connected to the bit line 517, the transistors 506 and 509 are connected to the bit line 518, and the transistors 507 and 510 are connected to the bit line 519.

In the case of reading out data of the memory cell 500, the row decoder 502 is operated to select the word line 520, so that the transistors 505 to 507 are turned ON. Then, the column decoder 501 is operated to turn ON the column switch 522, so that the bit line 517 and the output wiring 527 are connected to each other. Subsequently, the switch 526 is turned ON to connect the output wiring 527 to the memory load resistor 528 and the amplifier 504. At this time, the switch 525 is turned OFF.

When the transistor 505 is turned ON, current flows from the power source 1 to the memory load resistor 528, the switch 526, the output wiring 527, the column switch 522, the bit line 517, the fuse element 511, the transistor 505, and the power source 2. Potential drop is generated at the memory load resistor 528, thus input potential of the amplifier 504 becomes Lo in the case where ON resistance of the transistor 505 is sufficiently smaller than a resistance value of the memory load resistor 528. Memory cells are all the same at the initial stage, thus output is Lo when any of the transistors is turned ON.

The case where output of the memory cell 500 is Hi is described now.

In the case of reading out data of the memory cell 500, the row decoder 502 is operated to select the word line 520, so that the transistors 505 to 507 are turned ON. Then, the column decoder 501 is operated to turn ON the column switch 522, so that the bit line 517 and the output wiring 527 are connected to each other. Subsequently, the switch 526 is turned ON to connect the output wiring 527 to the memory load resistor 528 and the amplifier 504. At this time, the switch 525 is turned OFF.

In order to obtain Hi output of the memory cell 500 even when the transistor 505 is turned ON, it is required to be open by disconnecting the fuse element 511. At this time, no current except slight leak current flows to the memory load resistor 528, and input voltage of the amplifier 504 is equal to potential of the power source 1, thereby Hi is output to the output terminal 529. Note that the switch 525 is turned OFF.

The case of writing data to the memory cell 500 so as to output Hi is described next. The row decoder 502 is operated to select the word line 520, so that the transistors 505 to 507 are turned ON. Then, the column decoder 501 is operated to turn ON the switch 522, so that the bit line 517 and the output wiring 527 are connected to each other. At this time, the switch 525 is turned ON while the switch 526 is turned OFF. When the switch 525 is turned ON, the output wiring 527 is connected to the voltage boosting power source circuit 503, thereby applied with high voltage. The fuse element 511 is connected to the output wiring 527 through the column switch 522, and the transistor 505 is turned ON. Accordingly, high voltage is applied to both terminals of the fuse element 511 and the fuse element 511 is blown due to the current flow therethrough.

In this manner, a nonvolatile memory circuit can be realized by blowing a fuse element of a memory cell to which Hi is written.

Figure 12A:
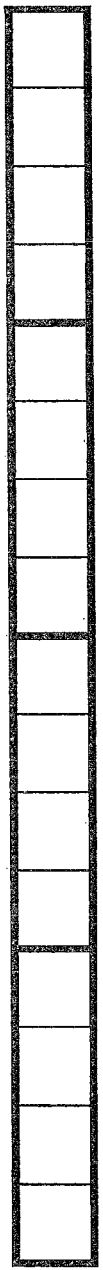
FIGS. 12A and 12B are diagrams each showing an example of data stored in a memory circuit.
Figure 12B:
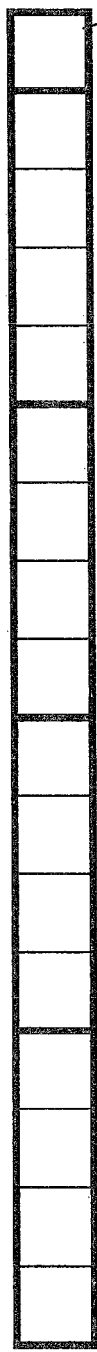

An embodiment mode where writing is carried out only one time is described below. In this embodiment mode, as shown in FIG. 12B, following a memory area (16 bytes in FIG. 12B) essentially required by a memory circuit, a bit for indicating the state of writing is added. Data for indicating whether writing is done or not is stored in this part.

Figure 13:
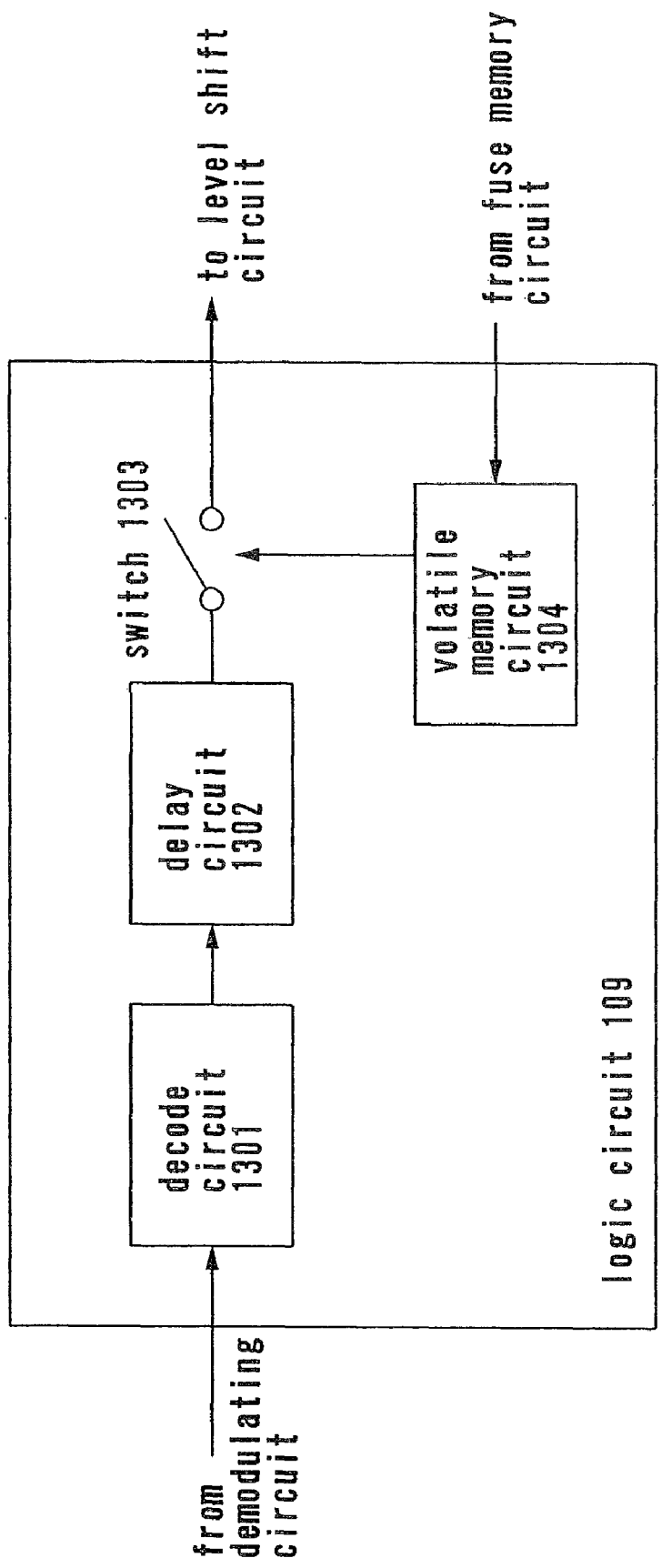
FIG. 13 is a block diagram of a logic circuit of the invention.

An operation thereof is described using FIG. 13. FIG. 13 shows an internal block of the logic circuit 109. The logic circuit 109 includes a decode circuit 1301, a delay circuit 1302, a switch 1303, and a volatile memory circuit 1304. At the initial stage, the bit for storing writing state shown in FIG. 12B indicates the non-writing state. It is assumed here that Lo is stored. (Lo is stored for ease of description, though Hi may be stored instead). When a signal is input from the antenna circuit 101 to operate the stabilizing power source circuit 103, the fuse memory circuit 111 outputs this value to the volatile memory circuit 1304 within the logic circuit 109. The volatile memory circuit 1304 stores this value. The volatile memory circuit 1304 can employ any circuit configuration such as a DRAM, an SRAM, a register as long as it can store data.

On the other hand, a signal input from the demodulating circuit 113 is decoded by the decode circuit 1301, and input to the switch 1303 through the delay circuit 1302. The switch 1303 is controlled by the volatile memory circuit 1304 such that the switch 1303 is turned ON when the data of the volatile memory circuit 1304 is Lo as described above. When the switch 1303 is turned ON, a signal is output to the level shift circuit 110 and written to the fuse memory circuit 111. When the writing is terminated, Hi is stored in the bit for storing writing data shown in FIG. 12B (Lo is stored in the case where an initial value is Hi). The delay circuit 1302 serves to prevent data from being output to the level shift circuit 110 through the switch 1303 before the stabilizing power source circuit 103 is operated to determine the state of the switch 1303. The malfunction before a determination of the switch may be prevented by other means than the delay circuit.

When Hi is stored in the bit for storing writing state shown in FIG. 12B, the volatile memory circuit 1304 operates to turn OFF the switch 1303. In this manner, data after the first one cannot pass through the switch 1303, thereby data writing to the memory circuit can be performed only one time.

Figure 14:
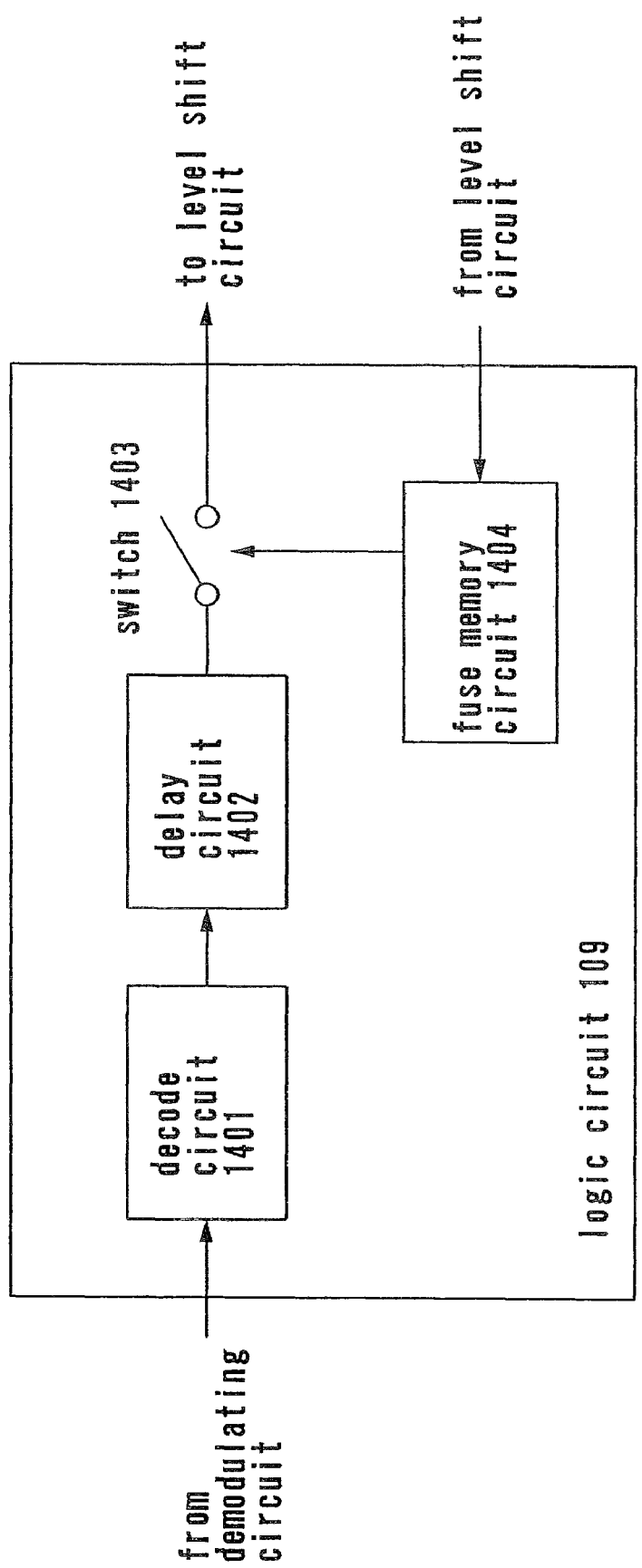
FIG. 14 is a block diagram of a logic circuit of the invention.

An embodiment mode of writing data only once, which is different from the one shown in FIG. 13, is described with reference to FIG. 14. FIG. 14 is a block diagram showing the inside of the logic circuit 109. The logic circuit 109 includes a decode circuit 1401, a delay circuit 1402, a switch 1403, and a fuse memory circuit 1404. The writing state storage bit shown in FIG. 12B is stored in the fuse memory circuit 1404. In the initial state, the writing state storage bit shown in FIG. 12B indicates a state in which writing is not performed, which is a low state herein (it may be a high state as well). When a signal is inputted from the antenna circuit 101 and the stabilizing power supply is turned on, the data is transmitted to the level shift circuit 110 through the decode circuit 1401, the delay circuit 1402 and the switch 1403. After being level shifted by the level shift circuit 110, the data indicating the writing state is transmitted to the fuse memory circuit 1404 and stored.

On the other hand, a signal inputted from the demodulating circuit 113 is decoded by the decode circuit 1401, and inputted to the switch 1403 through the delay circuit 1402. The switch 1403 is controlled by the fuse memory circuit 1404, and operates so as to be turned on when data of the fuse memory circuit 1404 is low as described above. In the case of the switch 1403 being on, the signal is outputted to the level shift circuit 110, and written to the fuse memory circuit 111 through the level shift circuit 110. When the writing is completed, a high state is stored in the writing state storage bit (fuse memory circuit 1404) shown in FIG. 12B (in the case of the initial value being high, a low state is stored). The delay circuit 1402 prevents data from passing through the switch 1403 and being outputted to the level shift circuit 110 before the stabilizing power supply is turned on and the state of the switch 1403 is determined. Other means than the delay circuit may also be used for preventing errors before the state of the switch 1403 is determined.

When a high state is stored in the writing state storage bit shown in FIG. 12B, the fuse memory circuit 1404 operates so as to turn off the switch 1403. Accordingly, only the first data can pass through the switch 1404, thus the writing data to the memory circuit is limited to once.

Embodiment 1

Figure 6A:
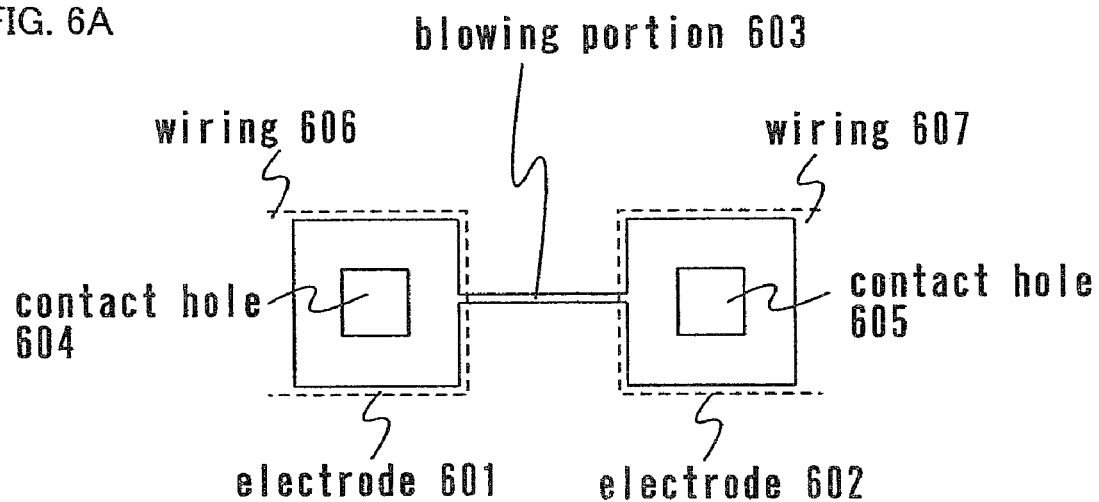
FIGS. 6A and 6B are diagrams each showing a constitution of a fuse element.

A fuse element is exemplary described using FIG. 6A. The fuse element shown in FIG. 6A is used by being blown its metal wiring like a general electronic fuse. As for the wiring material, a material for a gate electrode or a material for a source/drain electrode forming a thin film transistor (hereafter a TFT) can be employed. In order to blow with less heat generation, the width of the wiring is made as narrow as possible, and preferably 1 μm or less.

Figure 6B:
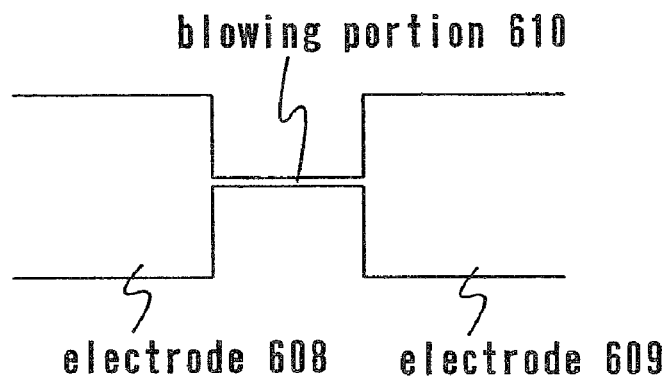

A fuse element using an island-shaped region of a TFT is described using FIG. 6B now. The fuse element shown in FIG. 6B flows a large amount of current. Therefore, a large amount of an N-type or P-type impurity is preferably added to suppress a resistance value thereof. In order to blow with less heat generation, the width of the wiring is made as narrow as possible, and preferably 1 μm or less.

Embodiment 2

Figure 7:
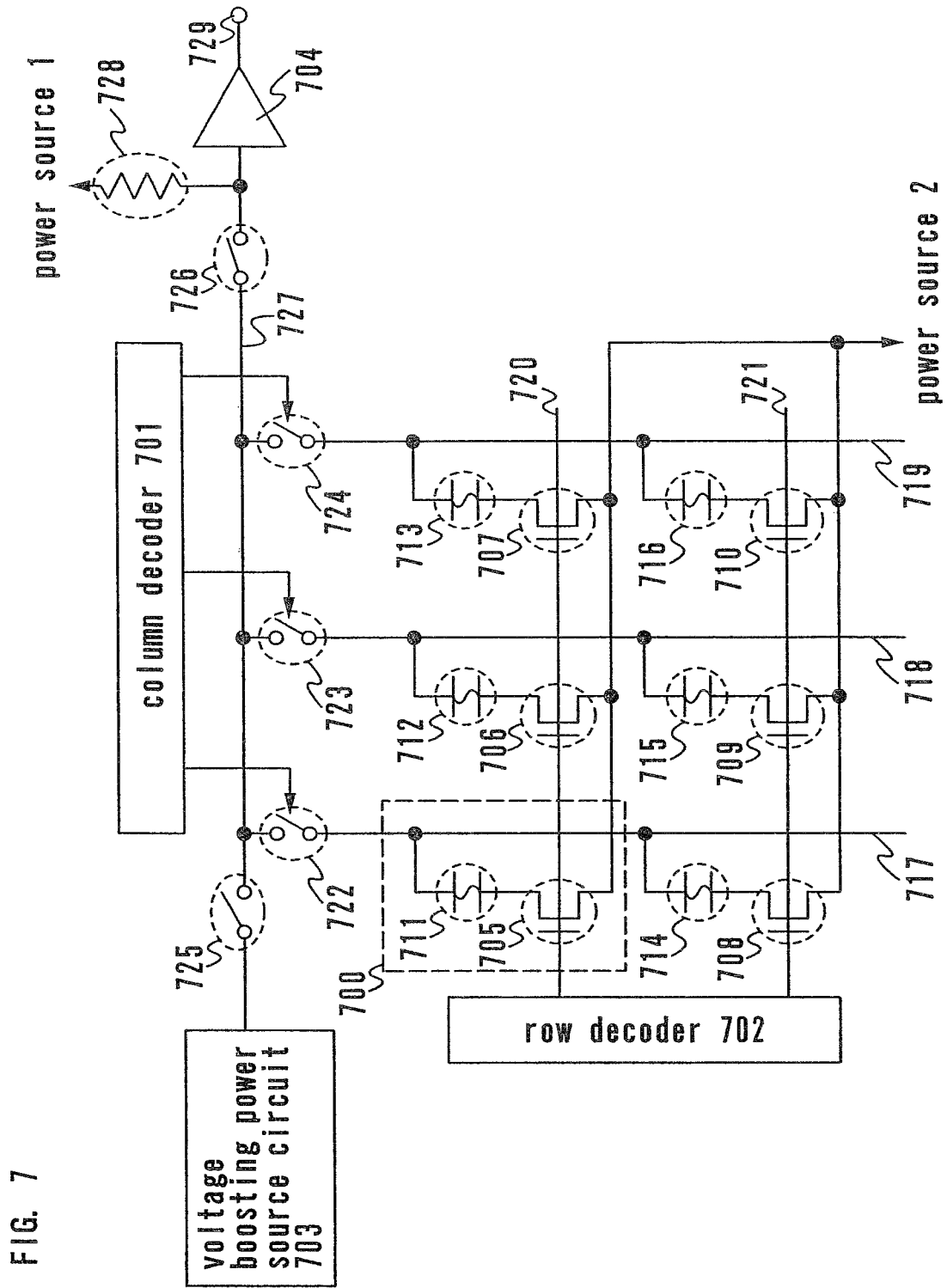
FIG. 7 is a diagram showing a circuit configuration of a fuse memory.

An embodiment of a fuse memory circuit using a fuse memory element which differs from the above-described one is described in FIG. 7. The fuse element in FIG. 7 uses a capacitor, which serves as a capacitor and is open with respect to direct current at the initial stage. When writing is over, both terminals are short-circuited because high voltage is applied to both electrodes of the fuse element, which are provided on both sides of an insulating film, and it breaks the insulating film to short-circuit.

An operation of the fuse memory circuit is described using FIG. 7 below. The fuse memory circuit shown in FIG. 7 is a 6-bit memory circuit for simplification, though the invention is not limited to a 6-bit. The fuse memory circuit includes a column decoder 701, a row decoder 702, a voltage boosting power source circuit 703, an amplifier 704, N-type transistors 705 to 710, fuse elements 711 to 716, bit lines 717 to 719, word lines 720 and 721, column switches 722 to 724, switches 725 and 726, an output wiring 727, a load resistor 728, an output terminal 729, a power source 1, and a power source 2 (see FIG. 7). The power source 1 serves to set Hi potential while the power source 2 serves to set Lo potential. Note that in the case where the transistors 705 to 710 are P-type transistors, the power source 1 serves to set Lo potential while the power source 2 serves to set Hi potential. In the description below, the transistors 705 to 710 are N-type transistors.

Description is made on a memory cell 700 including the transistor 705 and the fuse element 711 as an example.

First, the case of reading out data at the initial stage is described. The fuse elements 711 to 716 serve as capacitors at the initial stage, thereby the transistors 705 and 708 are not connected to the bit line 717 with a direct current flow, the transistors 706 and 709 are not connected to the bit line 718 with a direct current flow, and the transistors 707 and 710 are not connected to the bit line 719 with a direct current flow.

In the case of reading out data of the memory cell 700, the row decoder 702 is operated to select the word line 720, so that the transistors 705 to 707 are turned ON. Then, the column decoder 701 is operated to turn ON the column switch 722, so that the bit line 717 and the output wiring 727 are connected to each other. Subsequently, the switch 726 is turned ON to connect the output wiring 727 to the load resistor 728 and the amplifier 704. At this time, the switch 725 is turned OFF.

When the transistor 705 is turned ON, no current flows to the transistor 705 because the transistor 705 and the bit line 717 are not connected to each other with a direct current flow. Accordingly, no current flows to the load resistor 728, thus input potential of the amplifier 704 becomes Hi. Memory cells are all the same at the initial stage, thus output is Hi when any of the transistors is turned ON.

The case where output of the memory cell 700 is Lo is described below.

In the case of reading out data of the memory cell 700, the row decoder 702 is operated to select the word line 720, so that the transistors 705 to 707 are turned ON. Then, the column decoder 701 is operated to turn ON the column switch 722, so that the bit line 717 and the output wiring 727 are connected to each other. Subsequently, the switch 726 is turned ON to connect the output wiring 727 to the load resistor 728 and the amplifier 704. At this time, the switch 725 is turned OFF.

In order to obtain Lo output of the memory cell 700 even when the transistor 705 is turned ON, the fuse element 711 is required to be connected with a direct current flow. When the fuse element 711 is connected with a direct current flow, current flows from the power source 1 to the load resistor 728, the switch 726, the output wiring 727, the column switch 722, the bit line 717, the fuse element 711, the transistor 705, and the power source 2. Due to potential drop by this current, the output of the memory cell 700 becomes Lo. Thus, input potential of the amplifier 704 is equal to potential of the power source 2, thereby Lo is output to the output terminal 729. Note that the switch 725 is turned OFF.

The case of writing data to the memory cell 700 so as to output Lo is described next. The row decoder 702 is operated to select the word line 720, so that the transistors 705 to 707 are turned ON. Then, the column decoder 701 is operated to turn ON the column switch 722, so that the bit line 717 and the output wiring 727 are connected to each other. At this time, the switch 725 is turned ON while the switch 726 is turned OFF. When the switch 725 is turned ON, the output wiring 727 is connected to the voltage boosting power source circuit 703, thereby applied with high voltage. The fuse element 711 is connected to the output wiring 727 through the column switch 722, and the transistor 705 is turned ON. Accordingly, high voltage is applied to both terminals of the fuse element 711 and the fuse element 711 is short-circuited due to the current flow therethough.

In this manner, a nonvolatile memory circuit can be realized by short-circuiting a fuse element of a memory cell to which Lo is written.

Figure 8:
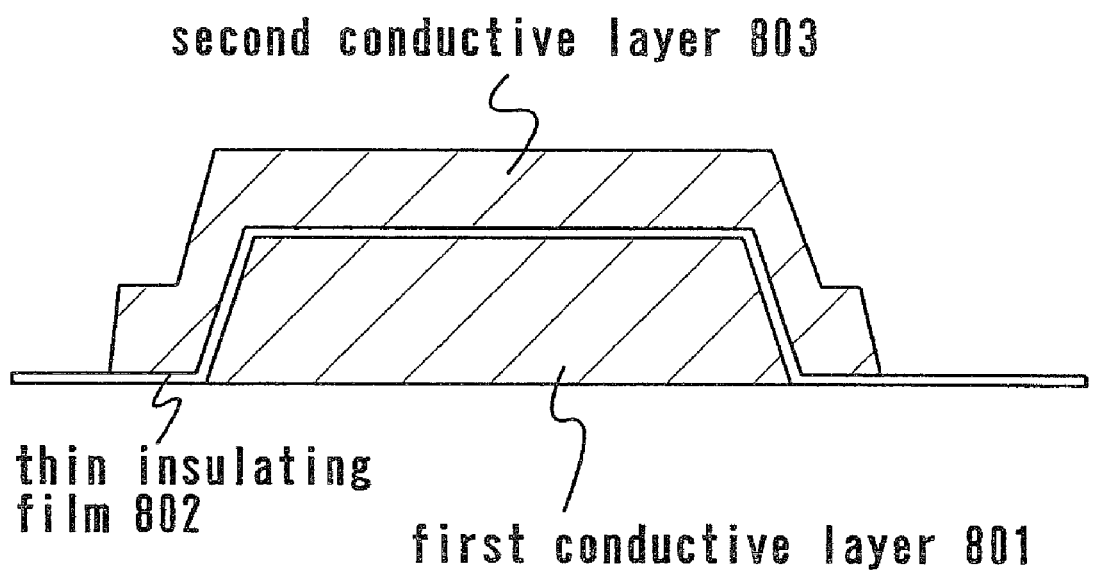
FIG. 8 is a diagram showing a structure of a capacitive fuse memory.

A fuse element used by being short-circuited its capacitor is described using a cross-sectional diagram of FIG. 8. A thin insulating film 802 is interposed between a first conductive layer 801 and a second conductive layer 803. High voltage is applied between the first conductive layer 801 and the second conductive layer 803, so that the insulating film 802 is broken and the first conductive layer 801 and the second conductive layer 803 are short-circuited.

Embodiment 3

Figure 9:
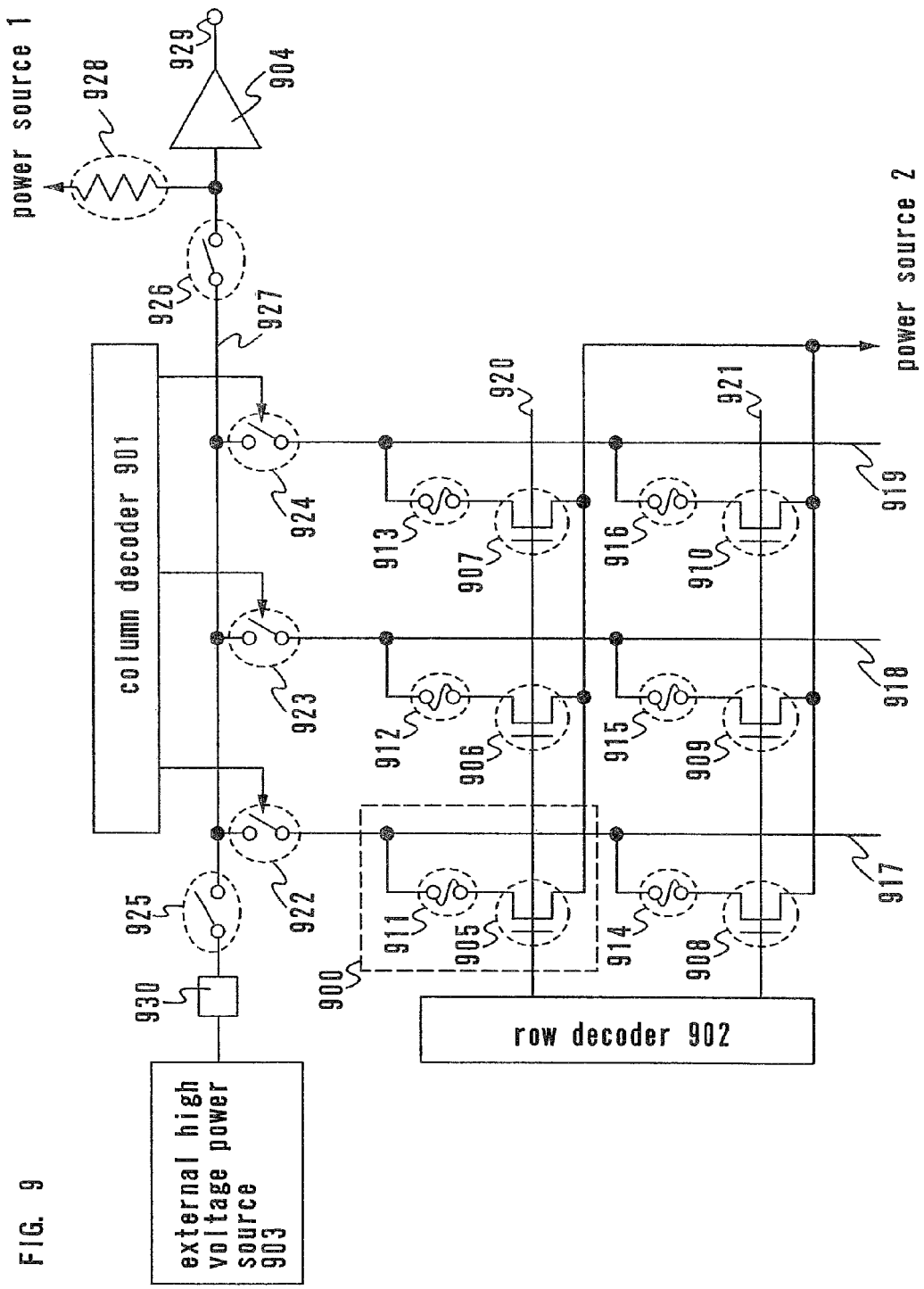
FIG. 9 is a diagram showing a circuit configuration of a fuse memory.

Described exemplary using FIG. 9 is the case where data is written to a fuse memory by an external high voltage power source 903, instead of generating high voltage by rectifying, stabilizing, and voltage-boosting an input signal from an antenna. In FIG. 9, the fuse element used by being blown a resistor shown in FIG. 5 is employed, though the fuse element used by being short-circuited a capacitor shown in FIG. 7 may employed as well. Such a writing by means of the external high voltage power source 903 is suitable for the case where data is written while the chip is inspected. A test apparatus for an LSI is generally equipped with a high voltage power source, which can be used to write data. After an electrical inspection of the chip, a pad 930 is connected to the external high voltage power source 903 through an inspection probe, so that writing can be carried out. An operation thereof is described below.

The fuse memory circuit includes a column decoder 901, a row decoder 902, an external high voltage power source 903, an amplifier 904, N-type transistors 905 to 910, fuse elements 911 to 916, bit lines 917 to 919, word lines 920 and 921, column switches 922 to 924, switches 925 and 926, an output wiring 927, a memory load resistor 928, an output terminal 929, a power source 1, and a power source 2 (see FIG. 9). The power source 1 serves to set Hi potential while the power source 2 serves to set Lo potential. Note that in the case where the transistors 905 to 910 are P-type transistors, the power source 1 serves to set Lo potential while the power source 2 serves to set Hi potential. In the description below, the transistors 905 to 910 are N-type transistors.

Description is made on a memory cell 900 including the transistor 905 and the fuse element 911 as an example.

First, the case of reading out data at the initial stage is described. The fuse elements 911 to 916 serve as electric wirings at the initial stage, thereby the transistors 905 and 908 are connected to the bit line 917, the transistors 906 and 909 are connected to the bit line 918, and the transistors 907 and 910 are connected to the bit line 919.

In the case of reading out data of the memory cell 900, the row decoder 902 is operated to select the word line 920, so that the transistors 905 to 907 are turned ON. Then, the column decoder 901 is operated to turn ON the column switch 922, so that the bit line 917 and the output wiring 927 are connected to each other. Subsequently, the switch 926 is turned ON to connect the output wiring 927 to the memory load resistor 928 and the amplifier 904. At this time, the switch 925 is turned OFF.

When the transistor 905 is turned ON, current flows from the power source 1 to the memory load resistor 928, the switch 926, the output wiring 927, the column switch 922, the bit line 917, the fuse element 911, the transistor 905, and the power source 2. Potential drop is generated at the memory load resistor 928, thus input potential of the amplifier 904 becomes Lo in the case where ON resistance of the transistor 905 is sufficiently smaller than a resistance value of the memory load resistor 928. Memory cells are all the same at the initial stage, thus output is Lo when any of the transistors is turned ON.

The case where output of the memory cell 900 is Hi is described next.

In the case of reading out data of the memory cell 900, the row decoder 902 is operated to select the word line 920, so that the transistors 905 to 907 are turned ON. Then, the column decoder 901 is operated to turn ON the column switch 922, so that the bit line 917 and the output wiring 927 are connected to each other. Subsequently, the switch 926 is turned ON to connect the output wiring 927 to the memory load resistor 928 and the amplifier 904. At this time, the switch 925 is turned OFF.

In order to obtain Hi output of the memory cell 900 even when the transistor 905 is turned ON, it is required to be open by disconnecting the fuse element 911. At this time, no current except slight leak current flows to the memory load resistor 928, and input voltage of the amplifier 904 is equal to potential of the power source 1, thereby Hi is output to the output terminal 929. Note that the switch 925 is turned OFF.

The case of writing data to the memory cell 900 so as to output Hi is described below. The row decoder 902 is operated to select the word line 920, so that the transistors 905 to 907 are turned ON. Then, the column decoder 901 is operated to turn ON the column switch 922, so that the bit line 917 and the output wiring 927 are connected to each other. At this time, the switch 925 is turned ON while the switch 926 is turned OFF. When the switch 925 is turned ON, the output wiring 927 is connected to the external high voltage power source 903 through the pad 930, thereby applied with high voltage. The fuse element 911 is connected to the output wiring 927 through the column switch 922, and the transistor 905 is turned ON. Accordingly, high voltage is applied to both terminals of the fuse element 911 and the fuse element 911 is blown due to the current flow therethrough.

In this manner, a nonvolatile memory circuit can be realized by blowing a fuse element of a memory cell to which Hi is written.

Embodiment 4

Figure 20:
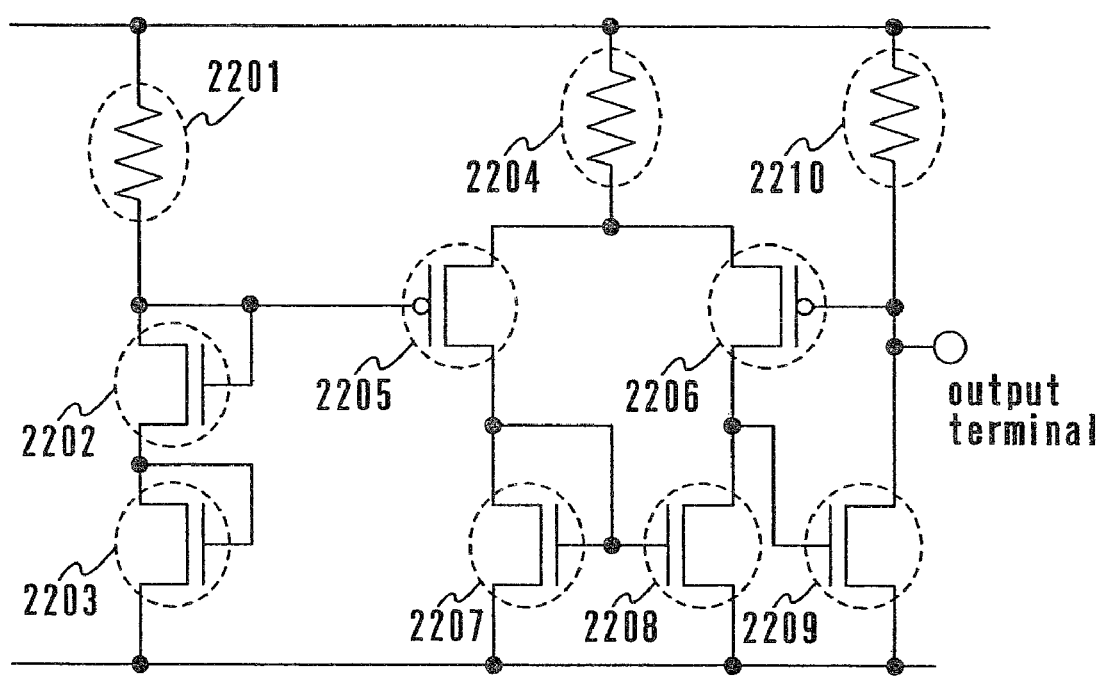
FIG. 20 is a diagram showing an example of a stabilizing power source circuit of the invention.

A stabilizing power source circuit is exemplary described using FIG. 20. The stabilizing power source circuit includes a reference voltage circuit and a buffer amplifier. The reference voltage circuit includes a resistor 2201 and diode-connected transistors 2202 and 2203, which generates reference voltage for two VGSs of the transistors. The buffer amplifier includes a differential circuit configured by transistors 2205 and 2206, a current mirror circuit configured by transistors 2207 and 2208, and a common source amplifier configured by a current supply resistor 2204, a transistor 2209 and a resistor 2210.

When current flowing from an output terminal is large, current supplied to the transistor 2209 is small, whereas when current flowing from the output terminal is small, current supplied to the transistor 2209 is large. The operation is carried out so that current flowing to the resistor 2210 is nearly constant. In addition, potential of the output terminal has almost the same value as the reference voltage circuit. Here, the stabilizing power source circuit includes the reference voltage circuit and the buffer amplifier, though the invention is not limited to the aforementioned one and it may have another configuration as well.

Embodiment 5

Figure 15:
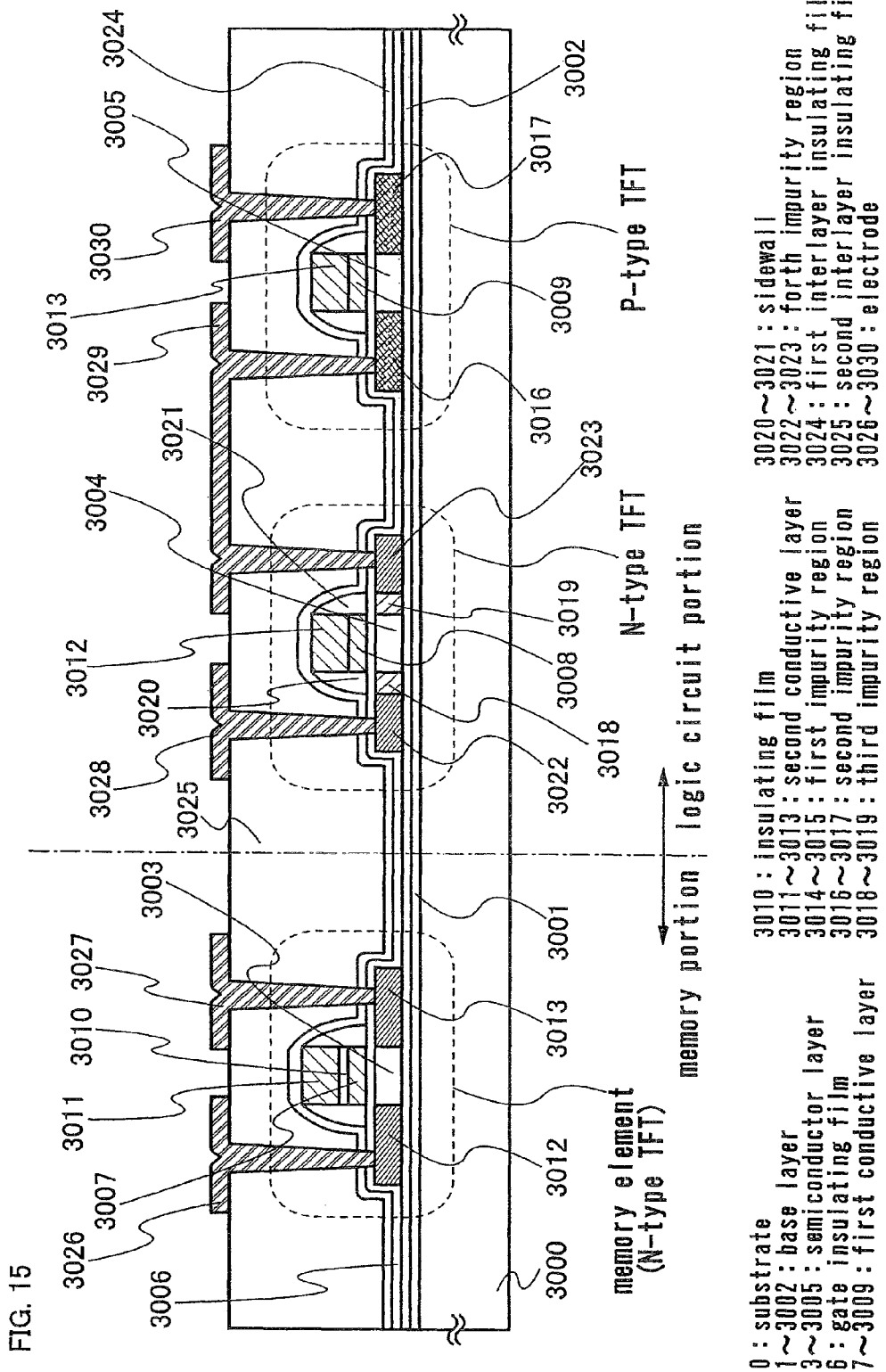
FIG. 15 is a cross-sectional view at a step of the invention.

Described using FIG. 15 is a method for manufacturing TFTs used for a memory element and a logic circuit portion such as a decoder, a selector, a writing circuit, and a reading circuit which are described in the embodiment mode over the same insulating substrate at the same time. In this embodiment, as a semiconductor element, an N-type memory element having a floating gate, an N-type TFT, and a P-type TFT are exemplary employed, though a semiconductor element used for the memory portion and the logic circuit portion according to the invention is not limited to the aforementioned ones. In addition, this manufacturing method is only an example and does not limit a manufacturing method over an insulating substrate.

First, base films 3001 and 3002 are formed by using an insulating film such as a silicon oxide film, a silicon nitride film, and a silicon oxynitride film over a glass substrate 3000. For example, a silicon oxynitride film with a thickness of 10 to 200 nm and a hydrogenated silicon oxynitride film with a thickness of 50 to 200 nm are laminated in this order as the base films 3001 and 3002 respectively.

Island-shaped semiconductor layers 3003 to 3005 are formed of a crystalline semiconductor film obtained by applying known laser crystallization or thermal crystallization to an amorphous semiconductor film. The island-shaped semiconductor layers 3003 to 3005 are formed to have a thickness of 25 to 80 nm. A material of the crystalline semiconductor film is not particularly restricted, though silicon or a silicon-germanium (SiGe) alloy may be preferably employed.

At this time, it is possible to carry out a treatment to provide an overlap region for getting out charge, to one of a source region and a drain region of the semiconductor layer 3003 of a TFT used for the memory element.

Subsequently, a gate insulating film 3006 is formed to cover the island-shaped semiconductor layer 3003 to 3005. The gate insulating film 3006 is formed of an insulating film containing silicon with a thickness of 10 to 80 nm by plasma CVD or sputtering. In the case of an OTP nonvolatile memory, in particular, writing by injecting hot electron and charge storage are important, therefore a gate insulating film preferably has a thickness of 40 to 80 nm to flow few tunnel current.

Then, a first conductive layer 3007 to 3009 is formed over the gate insulating film 3006 and removed by etching except a region for a floating gate electrode and a region for a gate electrode of a normal TFT.

A second gate insulating film 3010 is formed by using an insulating film containing silicon with a thickness of 10 to 80 nm by plasma CVD or sputtering. The second gate insulating film 3010 is removed by etching except a region of the memory element.

Subsequently, a second conductive layer 3011 to 3013 is formed. The laminated layer in which the first conductive layer 3007, the second gate insulating film 3010, and the second conductive layer 3011 are laminated in this order over the substrate (the memory element) and the laminated layer in which the first conductive layer 3008 and the second conductive layer 3012 and the laminated layer in which the first conductive layer 3009 and the second conductive layer 3013 are laminated in this order over the substrate (the normal TFT) are etched at the same time to form a floating gate electrode and a control gate electrode of the memory element, and a gate electrode of the normal TFT.

In this embodiment, the first conductive layer 3007 to 3009 is formed of TaN with a thickness of 50 to 100 nm and the second conductive layer 3011 to 3013 is formed of W with a thickness of 100 to 300 nm. A material of the conductive layer is not particularly restricted, and any element of Ta, W, Ti, Mo, Al, and Cu, an alloy material or a compound material containing such element as main constituent may be employed.

Then, N-type doping is carried out to the TFT used for the memory element to form a first impurity region 3014 and 3015. P-type doping is carried out to the P-type TFT for the logic circuit portion to form a second impurity region 3016 and 3017. Subsequently, in order to form an LDD region of an N-type TFT used for the logic circuit portion, N-type doping is carried out to form a third impurity region 3018 and 3019. After a sidewall 3020 and 3021 is formed, N-type doping is carried out to the N-type TFT used for the logic circuit portion to form a fourth impurity region 3022 and 3023. Such doping can be carried out by ion doping or ion implantation. Through the above-described steps, the impurity regions are formed in the island-shaped semiconductor layers respectively.

The impurity elements added in the island-shaped semiconductor layers are activated. This step is carried out by thermal annealing using an annealing furnace. Alternatively, laser annealing or rapid thermal annealing (RTA) may be adopted. Then, heat treatment is carried out at 300 to 450° C. for 1 to 12 hours in an atmosphere containing 3 to 100% of hydrogen to hydrogenate the island-shaped semiconductor layers. As other means for the hydrogenation, plasma hydrogenation (which uses hydrogen excited by plasma) may be carried out as well.

Next, a first interlayer insulating film 3024 is formed by using a silicon oxynitride film with a thickness of 10 to 80 nm nearly equal to the gate insulating film 3006. A second interlayer insulating film 3025 is formed by using an organic insulating material such as acryl thereover. Note that an inorganic material may be employed instead of an organic insulating material for the second interlayer insulating film 3025. Inorganic $SiO_2$, $SiO_2$ produced by plasma CVD (PCVD-$SiO_2$), SOG (Spin On Glass; a coated silicon oxide film), and the like are employed as the inorganic material. Etching is carried out in order to form a contact hole after forming the two interlayer insulating films.

Then, electrodes 3026 to 3027 for making a contact with a source region and a drain region of the island-shaped semiconductor layer at the memory portion are formed. Similarly, electrodes 3028 and 3030 are formed at the logic circuit portion.

In this manner, a memory portion comprising an N-type memory element having a floating gate and a logic circuit portion comprising an N-type TFT with an LDD structure and a P-type TFT with a single drain structure can be formed over the same substrate (see FIG. 15).

Embodiment 6

In this embodiment, a method for forming a memory portion and a logic circuit portion and transferring it to a flexible substrate is described using FIGS. 16A to 17B. Note that an N-type memory element having a floating gate, an N-type TFT, and a P-type TFT are described as examples of semiconductor elements in this embodiment, though semiconductor elements included in the memory portion and the logic circuit portion are not limited to these in the invention. This manufacturing method is only an example and does not limit a manufacturing method over an insulating substrate.

A peeling layer 4000 is formed over an insulating substrate 3000. For the peeling layer 4000, a layer containing silicon as main constituent can be employed such as amorphous silicon, poly-crystalline silicon, single-crystalline silicon, and microcrystalline silicon (including semi-amorphous silicon). The peeling layer 4000 can be formed by sputtering, plasma CVD, or the like. In this embodiment, amorphous silicon is formed with a thickness of about 500 nm by sputtering, which used as the peeling layer 4000. Subsequently, according to the manufacturing steps described in Embodiment 2, the memory portion and the logic circuit portion as shown in FIG. 15 are formed.

Next, a third interlayer insulating film 4001 is formed over the second interlayer insulating film 3025 and a pad 4002 to 4005 is formed. A conductive material of one or a plurality of metals and metal compounds of Ag, Au, Cu, Pd, Cr, Mo, Ti, Ta, W, Al, and the like.

Figure 16A:
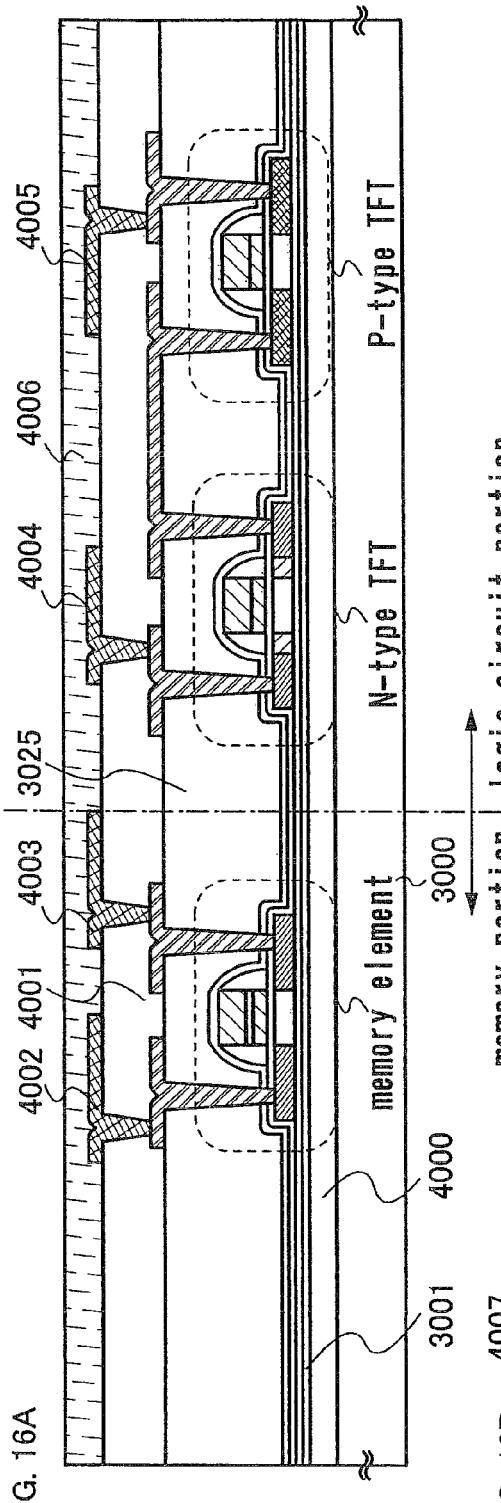
FIGS. 16A and 16B are cross-sectional views each at a step of the invention.

A protective layer 4006 is formed over the third interlayer insulating film 4001 so as to cover the pad 4002 to 4005. The protective layer 4006 is formed of a material which is capable of protecting the pad 4002 to 4005 when the peeling layer 4000 is removed by etching at a subsequent step. For example, an epoxy resin, an acrylate resin, or a silicon resin which can be melted in water or alcohol is applied to entire surface to form the protective layer 4006 (FIG. 16A).

Figure 16B:
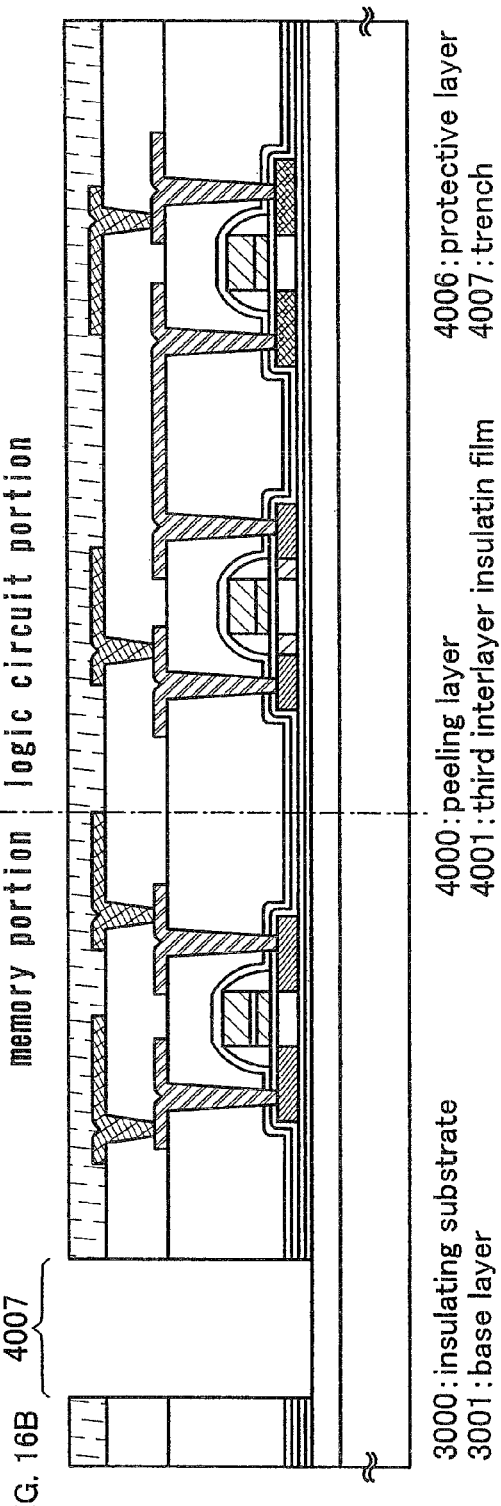

A trench 4007 is formed in order to peel off the peeling layer 4000 (see FIG. 16B). The trench 4007 is only required to be deep enough to appear the peeling layer 4000. Etching, dicing, scribing, or the like can be employed to form the trench 4007.

Then, the peeling layer 4000 is removed by etching (see FIG. 17A). In this embodiment, fluorine halide is employed as an etching gas, which is injected from the trench 4007. In this embodiment, $ClF_3$ (chlorine trifluoride), for example, is employed for etching in accordance with the following condition: a temperature of 350° C., a flow rate of 300 sccm, a pressure of 6 Torr, and a processing time of 3 hours. Alternatively, a mixed gas of nitrogen and $ClF_3$ may be employed as well. By employing fluorine halide such as $ClF_3$, the peeling layer 4000 is selectively etched to peel off the insulating substrate 3000. Note that fluorine halide may be gas or liquid.

Subsequently, the peeled memory portion and logic circuit portion are adhered to a supporter 4009 with an adhesive material 4008 (see FIG. 17B). As the adhesive material 4008, a material which can adhere the supporter 4009 and the base films 3001 to each other is employed. For example, various curable adhesive materials can be employed such as a reactive curable adhesive material, a heat curable adhesive material, a light curable adhesive material such as an ultraviolet curable adhesive material, and an anaerobic adhesive material.

For the supporter 4009, an organic material such as a flexible paper or plastic can be employed. A flexible inorganic material may be employed as well. In order to diffuse heat generated in an integrated circuit, the supporter 4009 preferably has high heat conductivity of about 2 to 30 W/mK.

Note that as for the method for peeling off integrated circuits in the memory portion and the logic circuit portion from the insulating substrate 3000, the invention is not limited to the method by adopting etching of a silicon film as is in this embodiment, and various methods can be adopted. For example, a metal oxide film is provided between a substrate having high heat resistance and the integrated circuit, and then crystallized to embrittle so that the integrated circuit is peeled off. Alternatively, a peeling layer may be destroyed by laser irradiation so that the integrated circuit is peeled off from the substrate. Alternatively, a substrate the integrated circuit is formed may be cut in a mechanical manner or may be removed by etching using a solution or a gas so that the integrated circuit is peeled off from the substrate.

In the case where a surface of the object curves and a supporter of an ID chip attached to the curving surface is bended so as to draw a curve like a conical surface or a cylindrical surface by moving a bus-bar, it is preferable that the direction of the bus-bar and the direction of a carrier flow of a TFT are identical. According to the above-described structure, the bending of the supporter less affects the property of the TFT. Furthermore, by forming an island-shaped semiconductor film to occupy an area ratio of 1 to 30% of an integrated circuit, the property of the TFT being affected due to the bending of the supporter can be more suppressed. This embodiment can be implemented in combination with the above-described embodiment mode and embodiments.

Embodiment 7

Figure 21A:
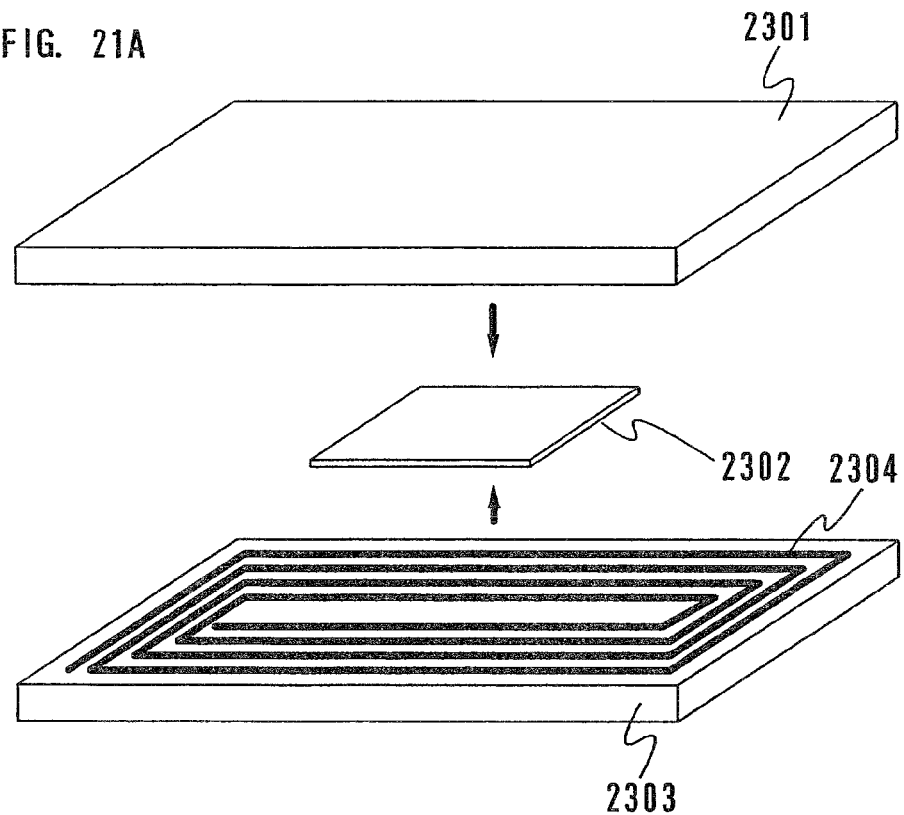
FIGS. 21A and 21B are diagrams of a semiconductor device of the invention which is combined with a protective layer.
Figure 21B:
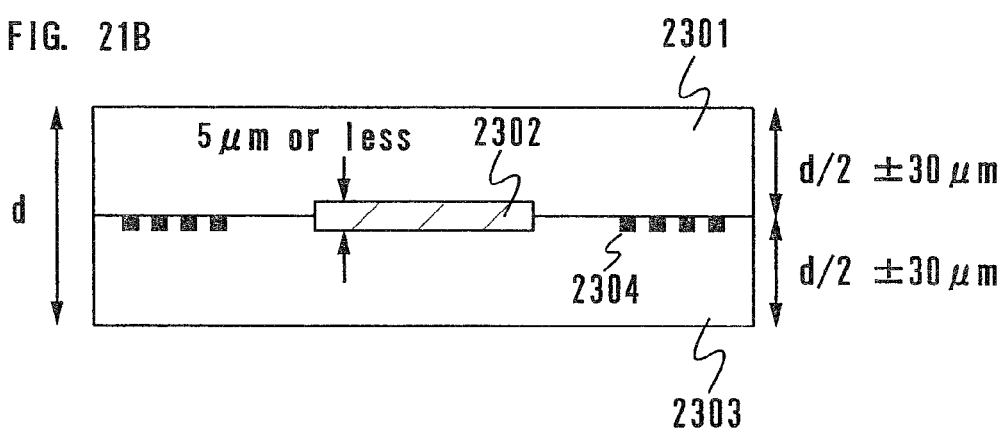

The case where a flexible ID tag is structured by a peeling process is exemplary described using FIGS. 21A and 21B. The ID tag comprises flexible protective layers 2301 and 2303 and an ID chip 2302 which is formed by a peeling process. In this embodiment, an antenna 2304 is formed not over the ID chip 2302 but over the protective layer 2303 and electrically connected to the ID chip 2302. In FIG. 21A, the antenna 2304 is formed over the protective layer 2303, though it may be formed over the protective layer 2301 as well. The antenna 2304 is preferably formed of silver, copper, or a metal coated by them. The ID chip 2302 and the antenna 2304 are connected to each other with an anisotropic conductive film by UV treatment, though a method for connecting is not limited to this.

FIG. 21B is a cross-sectional diagram of FIG. 21A. The thickness of the ID chip 2302 is 5 μm or less, and preferably 0.1 to 3 μm. As for the respective thickness of the protective layers 2301 and 2303, provided that the total thickness of the protective layers 2301 and 2303 is d, (d/2)±30 μm is preferable, and (d/2)±10 μm is most preferable. The respective thickness of the protective layers 2301 and 2303 are preferably 10 to 200 μm. The area of the ID chip 2302 is 5 mm square or less, and preferably 0.3 to 4 mm square.

The protective layers 2301 and 2303 are formed of an organic resin material and has a strong structure against the bending. The ID chip 2302 itself which is structured by a peeling process is also strong against the bending compared with a single-crystalline semiconductor, thereby it can be closely adhered to the protective layers 2301 and 2303. This ID chip 2302 sandwiched by the protective layers 2301 and 2303 may be further disposed over a surface or at inside of another individual object. In addition, it may be embedded into a paper.

Embodiment 8

Figure 19:
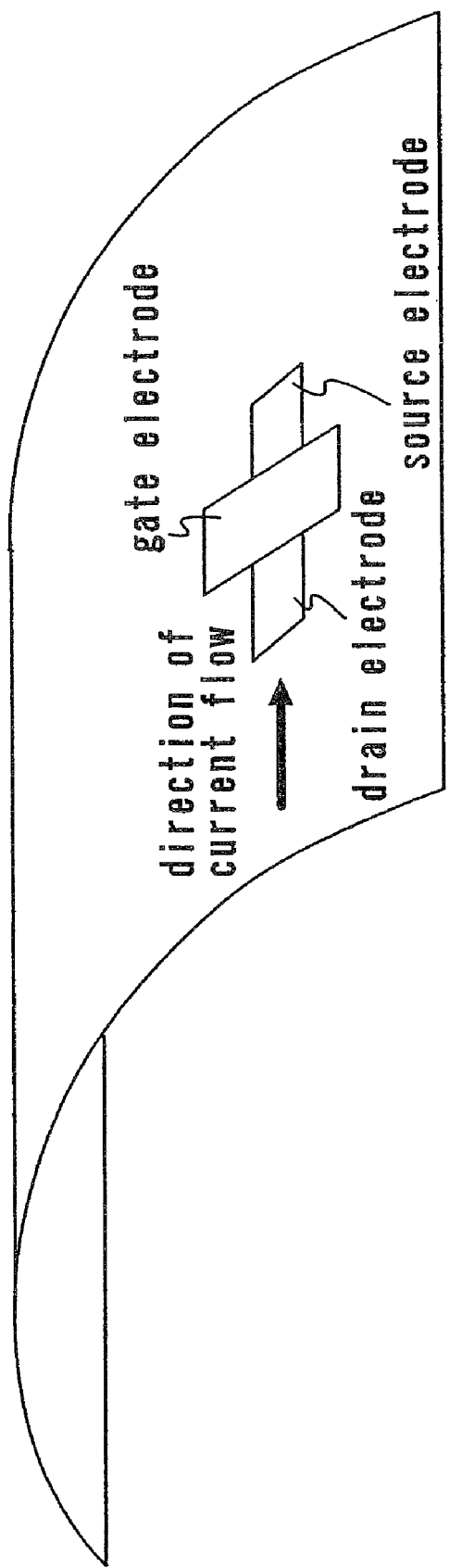
FIG. 19 is a diagram showing an arrangement of a TFT according to the invention.

The case where an ID chip is attached to a curving surface, that is the case where a TFT is disposed perpendicularly to an arc drawn by the ID chip is described using FIG. 19. The TFT of the ID chip shown in FIG. 19 is disposed such that the direction of a current flow or the position of a drain electrode, a gate electrode, to a source electrode is linear so as to be less affected by stress. By disposing in this manner, fluctuation of a TFT property can be suppressed. In addition, the crystal direction of the TFT is identical to the direction of a current flow. In the case where that crystal of the TFT is formed by a CWLC and the like, it can be formed to have an S value of 0.35 V/dec or less (preferably 0.09 to 0.25 V/dec) and mobility of 100 $cm^2$/Vs or mare.

A 19-stage ring oscillator constituted by such a TFT exhibits an oscillation frequency of 1 MHz or more, and preferably 100 MHz or more with power source voltage of 3 to 5 V. With the power source voltage of 3 to 5 V, the delay time per stage of the inverter is 26 ns, and preferably 0.26 ns or less.

In order to prevent an active element such as a TFT from being damaged due to stress, an active region (a silicon island region) of the active element such as a TFT is preferably occupied to 5 to 50% of the entire area.

In a region except the active element such as a TFT, a base insulating material, an interlayer insulating material, and a wiring material are mainly provided. An area except the active region of the TFT is preferably 60% or more of the entire area.

The thickness of the active region of the active element is 20 to 200 nm, typically 40 to 170 nm, and preferably 45 to 55 nm or 145 to 155 nm.

Embodiment 9

In this embodiment, the case where an external antenna is provided to a circuit using the invention is exemplary described using FIGS. 10A to 11C.

Figure 10A:
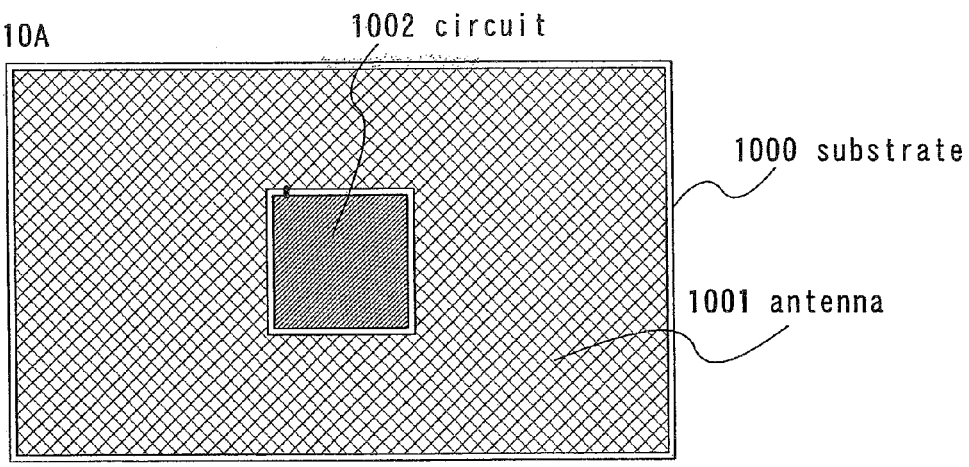
FIGS. 10A to 10E are diagrams each showing an embodiment of an antenna of the invention.

FIG. 10A shows the case where a circuit is surrounded by a sheet of antenna. An antenna 1001 is formed over a substrate 1000 and a circuit 1002 using the invention is connected thereto. In FIG. 10A, the circuit 1002 is surrounded by the antenna 1001, though the antenna 1001 may cover the entire surface and the circuit 1002 with electrodes may be adhered thereto.

Figure 10B:
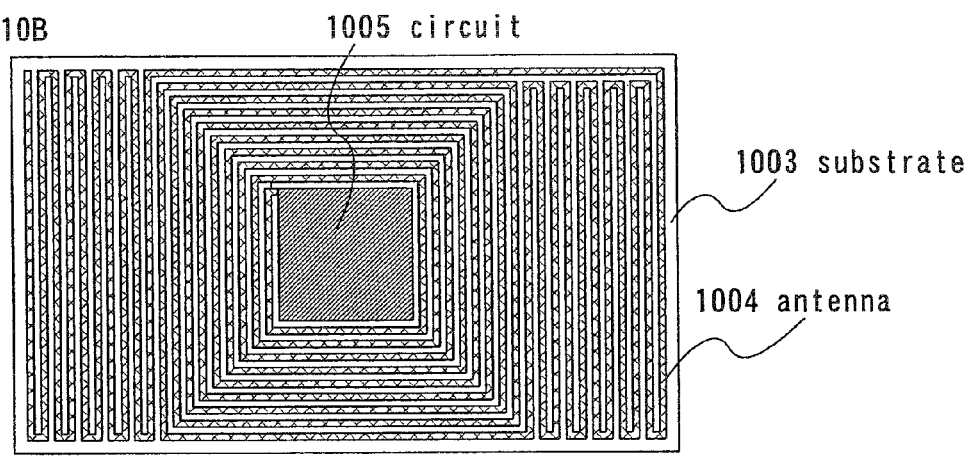

FIG. 10B shows the case where a thin antenna is disposed so as to surround a circuit. An antenna 1004 is formed over a substrate 1003 and a circuit 1005 using the invention is connected thereto. Note that the wiring of the antenna is not limited to this.

Figure 10C:
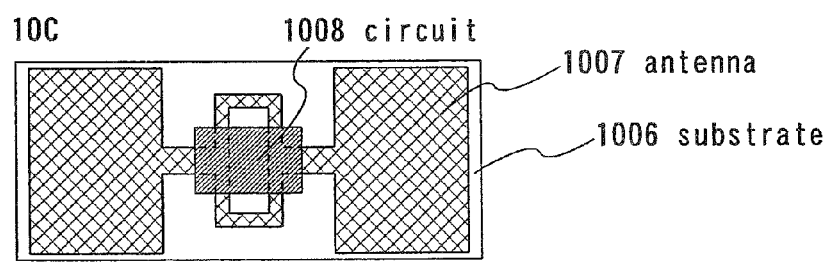

FIG. 10C shows the case where a high frequency antenna is provided. An antenna 1007 is formed over a substrate 1006 and a circuit 1008 using the invention is connected thereto.

Figure 10D:
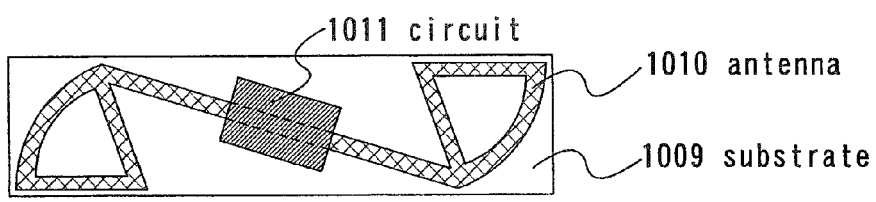

FIG. 10D shows the case where an antenna is an omnidirectional (capable of receiving radio waves from any direction) within 180°. An antenna 1010 is formed over a substrate 1009 to which a circuit 1011 using the invention is connected.

Figure 10E:
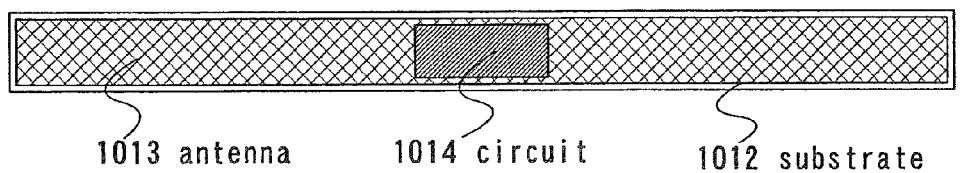

FIG. 10E shows the case where an antenna is in a shape of a long bar. An antenna 1013 is formed over a substrate 1012 to which a circuit 1014 using the invention is connected.

The circuit using the invention and these antennas can be connected by a known method. For example, the antenna and the circuit may be connected by wire bonding or bump bonding. Alternatively, a surface of the circuit formed as a chip may be used as an electrode to be adhered to the antenna. In the latter method, the circuit can be adhered to the antenna by using an ACF (anisotropic conductive film).

An appropriate length of the antenna is different depending on the frequency used for reception. It is generally preferable that the antenna is as long as an integer fraction of the frequency. For example, in the case where the frequency is 2.45 GHz, the length of the antenna may be preferably about 60 mm (½ wavelength) or about 30 mm (¼ wavelength).

Figure 11A:
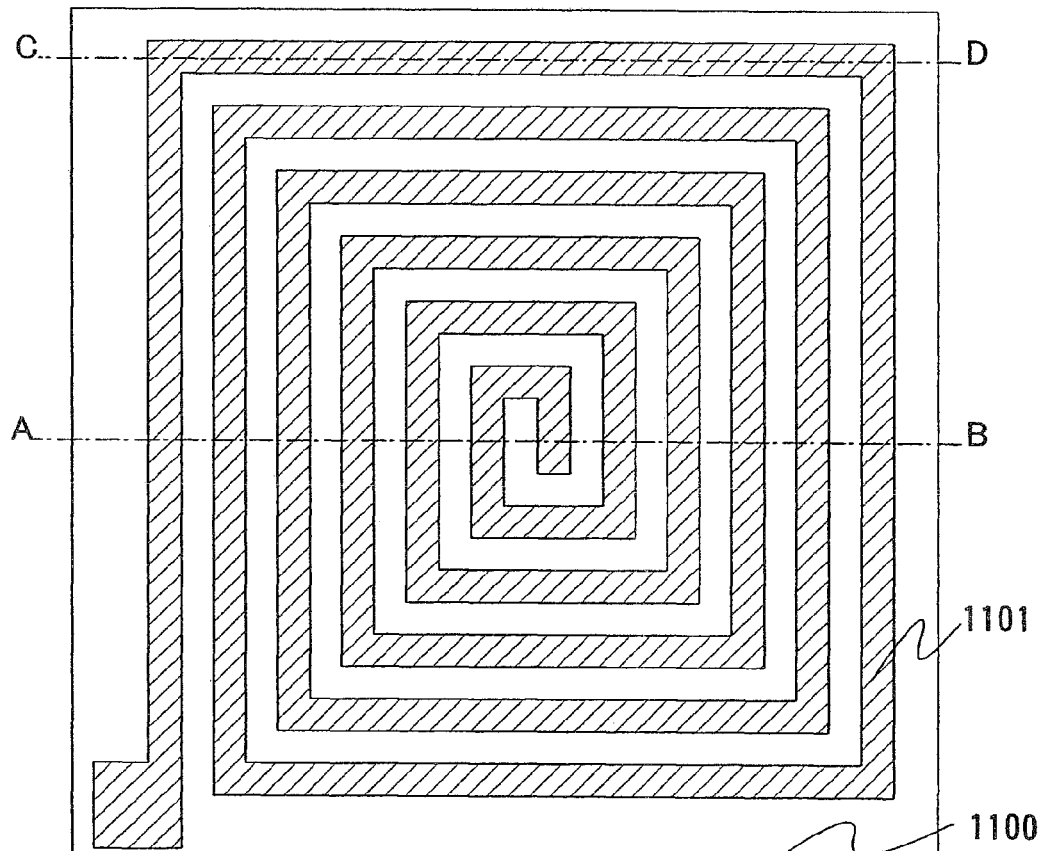
FIGS. 11A to 11C are diagrams showing an embodiment of an antenna of the invention.
Figure 11B:
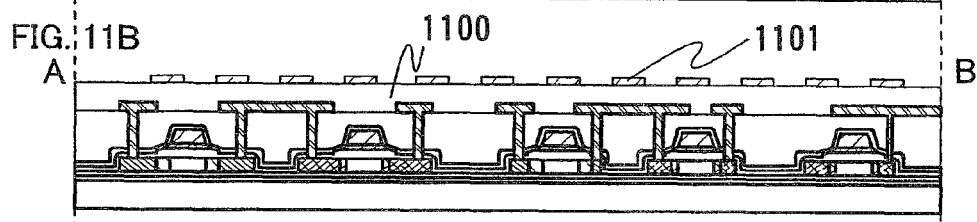
Figure 11C:
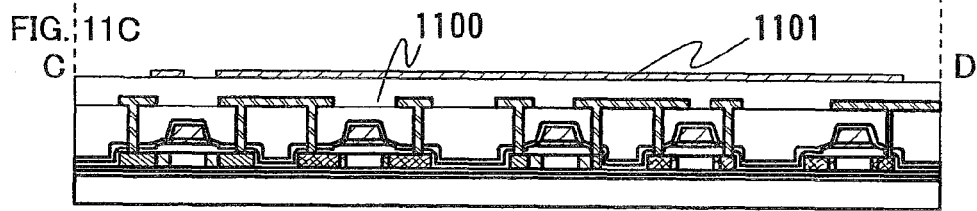

Moreover, it is possible to attach another substrate onto the circuit of the invention and form an antenna thereover. FIGS. 11A to 11C show a top plan view and cross-sectional views of a circuit over which a substrate is attached and a spiral antenna is provided thereover.

Note that this embodiment describes only an example and does not limit the shape of the antenna. The invention can be implemented with any form of antenna. This embodiment can be implemented in combination with any one of the structures of the embodiment mode and Embodiments 1 to 7.

Embodiment 10

In this embodiment, a method for manufacturing a thin film integrated circuit device comprising a TFT is described in detail with reference to FIGS. 22A to 24B. For simplicity, the manufacturing method is described herein by describing a cross-sectional structure of a CPU and a memory portion having N-type and P-type TFTs.

First, a peeling layer 61 is formed over a substrate 60 (FIG. 22A). The peeling layer 61 here is formed of an a-Si film (an amorphous silicon film) with a thickness of 50 nm (500 Å) over a glass substrate (e.g., a 1737 substrate, product of Corning Incorporated) by low pressure CVD. As for the substrate, a quartz substrate, a substrate made of an insulating material such as alumina, a silicon wafer substrate, a plastic substrate having enough heat resistance to the treatment temperature in the subsequent step, and the like may be employed as well as the glass substrate.

As for the peeling layer, a layer containing silicon as main constituent is preferably employed such as poly-crystalline silicon, single-crystalline silicon, SAS (semi-amorphous silicon which is also referred to as micro-crystalline silicon) as well as amorphous silicon, though the invention is not limited to this. The peeling layer may be formed by plasma CVD or sputtering as well as low pressure CVD. In addition, a film doped with an impurity such as phosphorous may be employed as well. The thickness of the peeling layer is preferably 50 to 60 nm, though may be 30 to 50 nm in the case of employing a SAS.

Next, a protective layer 55 (also referred to as a base film or a base insulating film) is formed over the peeling layer 61 (FIG. 22A). Here, the protective layer 55 is structured by three layers of a SiON film with a thickness of 100 nm, a SiNO film with a thickness of 50 nm and a SiON film with a thickness of 100 nm in this order over the substrate, though a material, the thickness, and the number of layers are not limited to this. For example, instead of the lowest layer of the SiON film, a heat-resistant resin such as siloxane may be formed with a thickness of 0.5 to 3 μm by spin coating, slit coating, droplet discharge, or the like. Alternatively, a silicon nitride film (e.g., SiN, $Si_3N_4$) may be employed. In addition, respective thickness are preferably 0.05 to 3 μm and can be selected within this range as required.

Here, a silicon oxide film can be formed by thermal CVD, plasma CVD, atmospheric pressure CVD, bias ECR-CVD, or the like using a mixed gas such as $SiH_4/O_2$ and TEOS (tetraethoxy silane)/$O_2$. A silicon nitride film can be formed by plasma CVD using a mixed gas of $SiH_4/NH_3$. The SiON film and the SiNO film can be typically formed by plasma CVD using a mixed gas of $SiH_4/N_2O$.

Note that in the case where a material containing silicon as main constituent such as a-Si is employed for the peeling layer 61 and an island-shaped semiconductor film 57, SiOxNy may be employed as a protective film to contact them in order to ensure adhesion.

Subsequently, a thin film transistor (TFT) for configuring a CPU or a memory of a thin film integrated circuit device is formed over the protective layer 55. Note that a thin film active element such as an organic TFT and a thin film diode may be formed as well as the TFT.

As a method for forming the TFT, the island-shaped semiconductor film 57 is formed first over the protective layer 55 (FIG. 22B). The island-shaped semiconductor film 57 is formed of an amorphous semiconductor, a crystalline semiconductor, or a semi-amorphous semiconductor. In any case, a semiconductor film containing silicon, silicon germanium (SiGe), or the like as main constituent can be employed.

Here, amorphous silicon is formed with a thickness of 70 nm and a surface thereof is treated with a solution containing nickel. Thermal crystallization is carried out at a temperature of 500 to 750° C. so that a crystalline silicon semiconductor film is obtained. Then, the crystallinity thereof is improved by laser crystallization. Note that as a forming method of the film, plasma CVD, sputtering, LPCVD, or the like may be adopted. As a crystallizing method thereof, laser crystallization, thermal crystallization, or thermal crystallization using a catalyst (e.g., Fe, Ru, Rh, Pd, Os, Ir, Pt, Cu, Au) can be adopted, or such methods may be carried out alternately a plurality of times.

In addition, as for the crystallization treatment of a semiconductor film having an amorphous structure, a continuous-wave laser may be used. In order to obtain a crystal with a large grain size in crystallizing, a solid state laser capable of continuous wave may be used and it is preferable to apply from a second harmonic to a fourth harmonic of a fundamental wave (the crystallization at this case is referred to as CWLC). Typically, a second harmonic (532 nm) or a third harmonic (355 nm) of a fundamental wave of an $Nd:YVO_4$ laser (a fundamental wave: 1064 nm) may be applied. When a continuous-wave laser is used, laser light emitted from a continuous-wave $YVO_4$ laser of which output is 10 W is converted into a harmonic by a non-linear optical element. In addition, there is a method for emitting a harmonic by putting an $YVO_4$ crystal or a $GdVO_4$ crystal and a non-linear optical element in a resonator. Then, the laser light is preferably shaped into a rectangular shape or an ellipse shape at an irradiated surface with an optical system to irradiate a subject. In that case, the power density of about 0.01 to 100 $MW/cm^2$ (preferably 0.1 to 10 $MW/cm^2$) is required. Then, the semiconductor film is preferably irradiated while being moved relatively to the laser light at a speed of about 10 to 2000 cm/s.

In addition, in the case where a pulsed laser is used, the pulsed laser having a frequency band from several tens to several hundreds Hz is generally used, though the pulsed laser having an extremely higher oscillation frequency of 10 MHz or more may be used as well (the crystallization at this case is referred to as MHzLC). It is said that it takes several tens to several hundreds nsec to solidify a semiconductor film completely after the semiconductor film is irradiated with the pulsed laser light. When the pulsed laser light has an oscillation frequency of 10 MHz or more, it is possible to irradiate the next pulsed laser light by the previous laser light until the semiconductor film is solidified after it is melted. Therefore, unlike the case of the conventional pulsed laser, the interface between the solid phase and the liquid phase can be moved continuously in the semiconductor film, and the semiconductor film having a crystal grain grown continuously along the scanning direction is formed. Specifically, it is possible to form an aggregation of crystal grains each of which has a width of 10 to 30 μm in the scanning direction and a width of about 1 to 5 μn in a direction perpendicular to the scanning direction. By forming such a crystal grain of a single crystal extended long in the scanning direction, a semiconductor film having few grain boundary at least in the channel direction of the TFT can be formed.

Note that in the case where siloxane or a heat-resistant resin is employed to the protective layer 55 partially, a heat leak from the semiconductor film can be prevented in the above-described crystallization, thereby the crystallization can be carried out efficiently.

The crystalline silicon semiconductor film is obtained in this manner. The crystals thereof are preferably aligned in the same direction as the direction of a source, a channel, and a drain. The thickness of the crystalline layer thereof is preferably 20 to 200 nm (typically 40 to 170 nm, and more preferably 50 to 150 nm). Subsequently, an amorphous silicon film for carrying out gettering a metal catalyst is formed over the semiconductor film with an oxide film interposed therebetween, and heat treatment at 500 to 750° C. is carried out to carry out the gettering. Furthermore, in order to control a threshold value as a TFT element, boron ion is injected into the crystalline silicon semiconductor film at the amount of $10^{13}/cm^2$. Etching is carried out with a resist used as a mask to form the island-shaped semiconductor film 57.

Note that for forming a crystalline semiconductor film, the crystalline semiconductor film can be obtained as well by directly forming a poly-crystalline semiconductor film by LPCVD (low pressure CVD) using a source gas of disilane ($Si_2H_6$) and germanium fluoride ($GeF_4$). The flow rate ratio of the gas is $Si_2H_6/GeF_4$=20/0.9, the temperature for forming the film is 400 to 500° C., and He or Ar is used as a carrier gas, though the invention is not limited to these.

Note that a channel region of the TFT is, in particular, preferably added with hydrogen or halogen of $1\times10^{19}$ to $1\times10^{22}$ cm$^{-3}$, preferably at $1\times10^{19}$ to $5\times10^{20}$ cm$^{-3}$. In the case of a SAS, it is preferably added of $1\times10^{19}$ to $2\times10^{21}$ cm$^{-3}$. In any case, it is preferable that the amount of hydrogen or halogen is larger than that contained in a single crystal used for an IC chip. Accordingly, a local crack which may be generated at the TFT portion can be terminated by the hydrogen or halogen.

Then, a gate insulating film 58 is formed over the island-shaped semiconductor film 57 (FIG. 22B). The gate insulating film 58 is preferably formed of a single layer or a laminated layer containing silicon nitride, silicon oxide, silicon nitride oxide, or silicon oxynitride by a method for forming a thin film such as plasma CVD, sputtering, or the like. In the case of the laminated layer, a three-layered structure in which a silicon oxide film, a silicon nitride film, and a silicon oxide film are laminated in this order over the substrate is, for example, preferable.

Subsequently, a gate electrode 56 is formed (FIG. 22C). Here, Si and W (tungsten) are stacked by sputtering, and etched with a resist 62 used as a mask to form the gate electrode 56. Needless to say, the material, the structure, and the forming method of the gate electrode 56 are not limited to these and can be selected appropriately. For example, a laminated structure of Si doped with an N-type impurity and NiSi (Nickel Silicide), or a laminated structure of TaN (tantalum nitride) and W (tungsten) may be employed. Alternatively, the gate electrode 56 may be formed of a single layer employing any conductive material.

A mask of SiOx or the like may be used instead of the resist mask. In this case, a step of forming the mask of SiOx, SiON, or the like (referred to as a hard mask) by patterning is additionally required, while the film of the mask is less decreased in etching compared with the case of the resist mask so that a gate electrode layer can be formed with a desired width. Alternatively, the gate electrode 56 may be selectively formed by droplet discharge without the resist 62.

As for the conductive material, various kinds of materials can be selected depending on the function of the conductive film. In addition, in the case where the gate electrode and the antenna are formed at the same time, the material is preferably selected in consideration of their functions.

As an etching gas in forming the gate electrode by etching, a mixed gas of $CF_4$, $Cl_2$, and $O_2$, or a $Cl_2$ gas is employed here, though the invention is not limited to these.

Subsequently, a resist 63 is formed so as to cover portions for P-type TFTs 70 and 72. An N-type impurity element 64 (typically P: phosphorous or As: arsenic) is doped into the island-shaped semiconductor films of N-type TFTs 69 and 71 at a low concentration with the gate electrode used as a mask (a first doping step, FIG. 22D). The first doping step is carried out in accordance with the following condition: the amount of $1\times10^{13}$ to $6\times10^{13}/cm^2$ and accelerated voltage of 50 to 70 keV, though the invention is not limited to this. In the first doping step, through doping is carried out through the gate insulating film 58 to form a couple of low concentration impurity regions 65. Note that the first doping step may be carried out to the entire surface without covering a P-type TFT region with resist.

After the resist 63 is removed by ashing or the like, a resist 66 is formed so as to cover an N-type TFT region. A P-type impurity element 67 (typically B: boron) is doped into the island-shaped semiconductor films of the P-type TFTs 70 and 72 at a high concentration with the gate electrode used as a mask (a second doping step, FIG. 22E). The second doping step is carried out in accordance with the following condition: the amount of $1\times10^{16}$ to $3\times10^{16}/cm^2$ and accelerated voltage of 20 to 40 keV, though the invention is not limited to this. In the second doping step, through doping is carried out through the gate insulating film 58 to form a couple of P-type high concentration impurity regions 68.

After the resist 66 is removed by ashing or the like, an insulating film 75 is formed over the substrate (FIG. 23F). Here, a $SiO_2$ film is formed with a thickness of 100 nm by plasma CVD. Then, the insulating film 75 and the gate insulating film 58 are removed by etching to form a sidewall 76 in a self-aligned manner (FIG. 23G). As an etching gas, a mixed gas of $CHF_3$ and He is employed. Note that the step of forming the sidewall is not limited to these.

Note that in the case where an insulating film is formed over a rear surface of the substrate as well when forming the insulating film 75, the insulating film over the rear surface is removed by etching with the resist which covers the entire surface of the substrate used as a mask (a rear surface treatment).

Figure 24A:
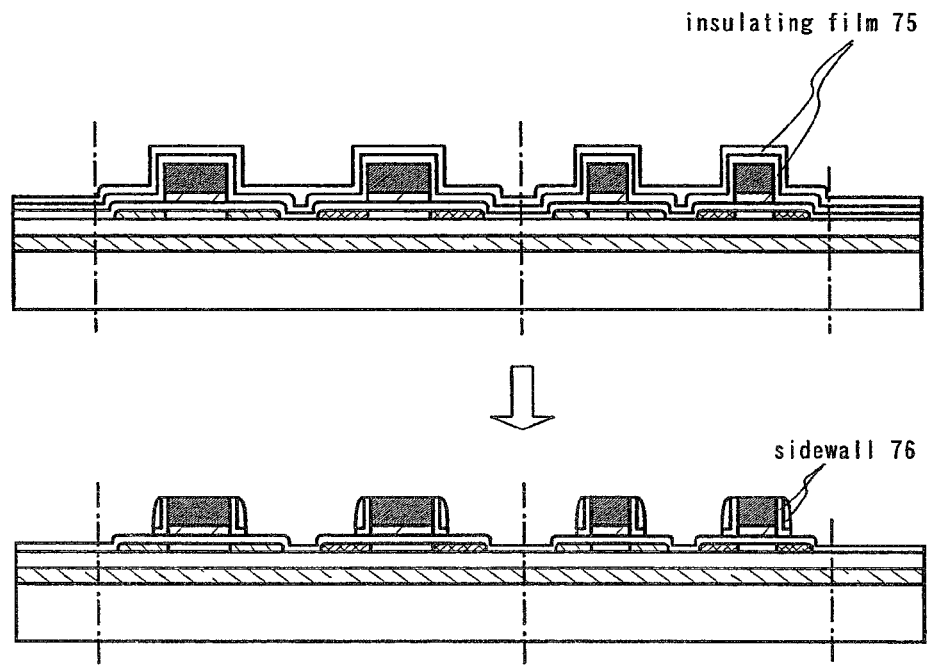
FIGS. 24A and 24B are cross-sectional views each at a step of the invention.

The forming method of the sidewall 76 is not limited to the above-described one. For example, methods shown in FIGS. 24A and 24B may be employed as well. FIG. 24A shows the case where the insulating film 75 is formed of two or more-laminated layers. As the insulating film 75, for example, a SiON (silicon oxynitride) film with a thickness of 100 nm and an LTO (Low Temperature Oxide) film with a thickness of 200 nm are laminated. Here, the SiON film is formed by plasma CVD, and a $SiO_2$ film is formed by low pressure CVD) as the LTO film. Then, etch back is carried out. Accordingly, the sidewall 76 is formed in which an arc shape and an L shape are formed.

Figure 24B:
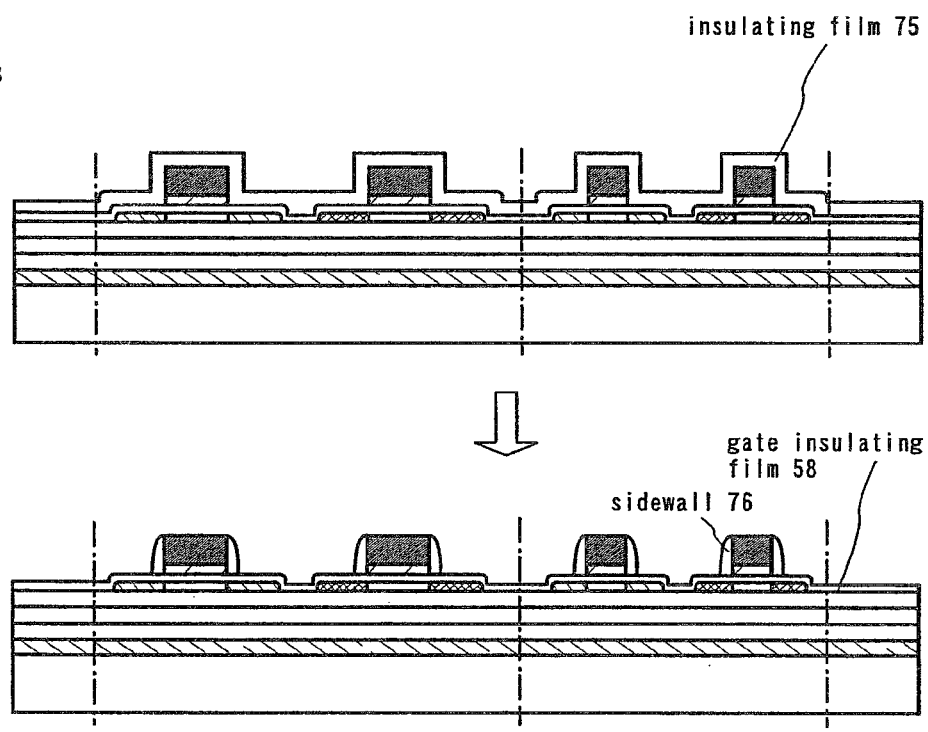

FIG. 24B shows the case where etching is carried out so that the gate insulating film 58 is not removed in carrying out etch back. The insulating film 75 for this case may be formed of a single layer or a laminated layer.

The sidewall is doped with an N-type impurity at a high concentration at a subsequent step, which serves as a mask when forming a low concentration impurity region or an offset region to which any is not doped is formed under the sidewall 76. In any of the above-mentioned forming methods of the sidewall, the condition of the etch back is preferably changed depending on the width of the low concentration impurity region or the offset region to be formed.

Subsequently, a resist 77 is formed so as to cover the P-type TFT region. An N-type impurity element 78 (typically P or As) is doped at a high concentration with the gate electrode 56 and the sidewall 76 used as a mask (a third doping step, FIG. 23H). The third doping step is carried out in accordance with the following condition: the amount of $1\times10^{13}$ to $5\times10^{15}/cm^2$ and accelerated voltage of 60 to 100 keV. In the third doping step, a couple of N-type high concentration impurity regions 79 is formed.

After the resist 77 is removed by ashing or the like, heat activation of the impurity region may be carried out. For example, a SiON film is formed with a thickness of 50 nm, and then heat treatment is carried out at 550° C. for 4 hours in a nitrogen atmosphere. Note that in the case where a SiNx film containing hydrogen is formed with a thickness of 100 nm, and heat treatment is carried out at 410° C. for 1 hour in a nitrogen atmosphere, a defect in the crystalline semiconductor film can be improved. This enables to, for example, terminate a dangling bond in the crystalline silicon and is called a hydrotreatment step or the like. Then, a SiON film is formed with a thickness of 600 nm as a cap insulating film for protecting the TFT. Note that the aforementioned hydrotreatment step may be carried out after the SiON film is formed. In that case, a SiNx film and a SiON film can be continuously formed. In this manner, an insulating film is formed by laminating three layers of SiON\ SiNx\ and SiON over the TFT, though the structure and the material are not limited to these. Note that it is preferable that such an insulating film is formed, because it also serves to protect the TFT.

Subsequently, an interlayer film 53 is formed over the TFT (FIG. 23I). For the interlayer film 53, polyimide, acrylic, polyamide, and a heat-resistant organic resin such as siloxane can be employed. As for the forming method, spin coating, dipping, spray application, droplet discharge (e.g., inkjet method, screen printing, offset printing), a doctor knife, a roll coater, a curtain coater, a knife coater, or the like can be employed. Alternatively, an inorganic material may be employed such as a film of silicon oxide, silicon nitride, silicon oxynitride, PSG (phosphorus glass), BPSG (glass of phosphorus and boron), and alumina. Note that these insulating films may be laminated to form the interlayer film 53 as well.

A protective film 54 may be formed over the interlayer film 53. As for the protective film 54, a film containing carbon such as DLC (Diamond Like Carbon) and carbon nitride (CN), a silicon oxide film, a silicon nitride film, a silicon nitride oxide film, or the like can be employed. As for the forming method, plasma CVD, atmospheric pressure plasma, or the like can be employed. Alternatively, a photosensitive or nonphotosensitive organic material such as polyimide, acrylic, polyamide, resist, and benzocyclobutene, or a heat-resistant organic resin such as siloxane may be employed.

Note that a filler may be mixed into the interlayer film 53 or the protective film 54 in order to prevent film detachment or a crack of these films due to stress generated by a difference of a thermal expansion coefficient between the interlayer film 53 or the protective film 54 and a conductive material or the like of a wiring formed at a subsequent step.

Then, a resist is formed and a contact hole is formed by etching, so that a wiring 51 for connecting the TFTs to each other and a connecting wiring 21 for connecting to an external antenna are formed (FIG. 23I). As for an etching gas for forming the contact hole, a mixed gas of $CHF_3$ and He is employed, though the invention is not limited to this. In addition, the wiring 51 and the connecting wiring 21 may be formed of the same material at the same time, or may be formed separately. Here, the wiring 51 connected to the TFT is formed of five layers of Ti \ TiN \ Al—Si \ Ti \ TiN by sputtering and patterning.

By mixing Si into the Al layer, hillock can be prevented from generating at the resist baking when the wiring is patterned. Instead of the Si, about Cu of 0.5% may be mixed. In addition, by sandwiching the Al—Si layer by Ti or TiN, hillock resistance can be further improved. At the patterning, the above-described hard mask of SiON or the like is preferably employed. Note that the material and the forming method of these wirings are not limited to these, and the aforementioned material for forming the gate electrode may be employed as well.

In this embodiment, a TFT region for forming a CPU 73, a memory 74, or the like and a terminal portion 80 for connecting to an antenna are integrally formed. This embodiment can be also applied to the case where a TFT region and an antenna are integrally formed. In that case, it is preferable that the antenna is formed over the interlayer film 53 or the protective film 54, and then covered by another protective film. As for the conductive material of the antenna, Ag, Au, Al, Cu, Zn, Sn, Ni, Cr, Fe, Co, Ti, or an alloy thereof can be employed, though the invention is not limited to these. The wiring and the antenna may be formed by different materials from each other. In addition, it is preferable that the wiring and the antenna are formed so as to contain a metal material having high ductility and malleability, and more preferably, the thickness thereof is increased in order to withstand the stress due to deformation.

As for the forming method, the film may be formed over the entire surface by sputtering and patterned with a resist mask, or may be selectively formed by droplet discharge using a nozzle. The droplet discharge here includes offset printing, screen printing, or the like in addition to inkjet method. The wiring and the antenna may be formed at the same time, or may be formed separately such that one of them is formed first, and then the other is formed so as to overlap.

According to the above-described steps, a thin film integrated circuit device comprising a TFT is obtained. In this embodiment, a top gate structure is employed, though a bottom gate structure (an inversely staggered structure) may be employed as well. In a region except the thin film active element region (an active element) such as a TFT, a base insulating film material, an interlayer insulating film material, and a wiring material are mainly provided. They occupy preferably 50% or more, and more preferably 70 to 95% of the whole thin film integrated circuit device. According to this, the IC chip can be easily bent, thereby its completed product like ID label can be easily handled. In that case, an island-shaped semiconductor region (an island) of the active element including the TFT portion occupy preferably 1 to 30%, and more preferably 5 to 15% of the whole thin film integrated circuit device.

In addition, as shown in FIG. 23I, the thickness of the protective layer or the interlayer film is preferably controlled such that a distance ($t_{under}$) between the semiconductor layer of the TFT and the lower protective layer, and a distance ($t_{over}$) of the semiconductor layer to the upper interlayer film (or the upper protective layer if formed) are the same or almost the same in the thin film integrated circuit device. By disposing the semiconductor layer in the middle of the thin film integrated circuit device in this manner, stress applied to the semiconductor layer can be alleviated, thereby generation of a crack can be prevented.

Embodiment 11

In this embodiment, a semiconductor device of the invention can be applied to an IC card, an IC tag, an RFID, a transponder, a paper money, a valuable instrument, a passport, electronic device, a bag, and clothing. Examples of an IC card, an ID tag, an ID chip, and the like are described using FIGS. 18A to 18H.

Figure 18A:
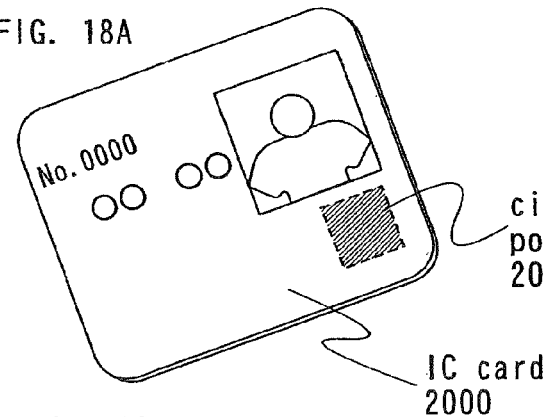
FIGS. 18A to 18H are views illustrating applications of the invention.

FIG. 18A illustrates an IC card which can be used for identification of an individual and as a credit card or electronic money by which payment can be made without using cash by utilizing a rewritable memory in an incorporated circuit. A circuit portion 2001 using the invention is incorporated in an IC card 2000.

Figure 18B:
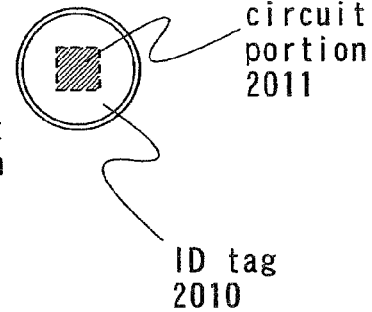

FIG. 18B illustrates an ID tag which can be used for identification of an individual and for management of entrance at a specific place by virtue of its compactness. A circuit portion 2011 using the invention is incorporated in an ID tag 2010.

Figure 18C:
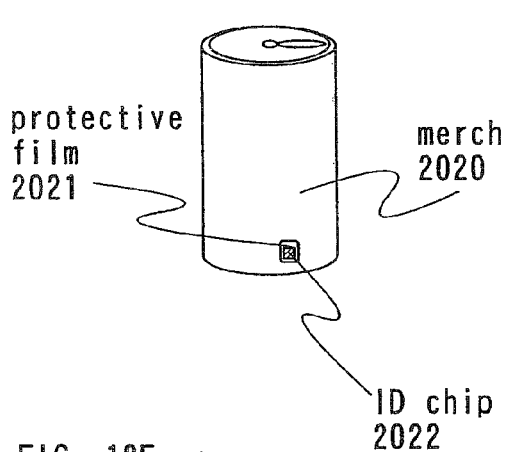

FIG. 18C illustrates the case where an ID chip 2022 is attached to merchandise 2020 for merchandise management at a retail store such as a supermarket. The invention is applied to a circuit in the ID chip 2022. By using an ID chip in this manner, not only the inventory management is simplified, but shoplifting and the like can be prevented as well. In FIG. 18C, a protective film 2021 is provided for adhesion to prevent the ID chip 2022 from being detached, though the ID chip 2022 may be directly attached with an adhesive. Moreover, it is preferable that a flexible substrate as mentioned in Embodiment Mode 2 is used for forming the ID chip 2022 in view of attaching to merchandise.

Figure 18D:
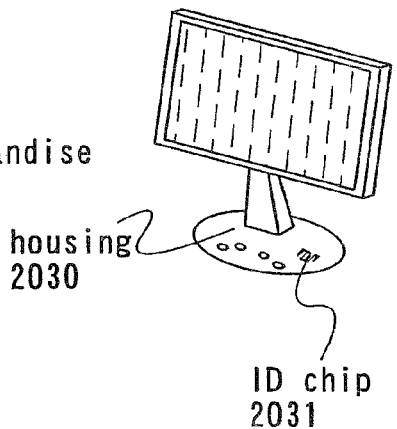

FIG. 18D illustrates the case where an ID chip for identification is incorporated in merchandise when manufactured. In FIG. 18D, an ID chip 2031 is incorporated in a housing 2030 of a display. The invention is applied to a circuit in the ID chip 2031. With such a structure, identification of a manufacturer, a distribution management, and the like of the merchandise can be simplified. Note that a housing of a display is taken as an example here, though the invention is not limited to this and can be applied to various electronic device and objects.

Figure 18E:
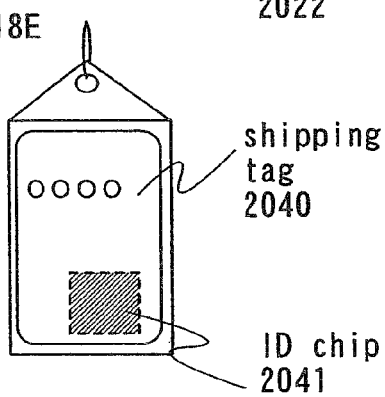

FIG. 18E illustrates a shipping tag for transporting objects. In FIG. 18E, an ID chip 2041 is incorporated in a shipping tag 2040. The invention is applied to a circuit in the ID chip 2041. With such a structure, selection of destination and distribution management of merchandise can be simplified. Note that the shipping tag is fastened to a string for tying up an object here, though the invention is not limited to this and the tag may be directly attached to an object with a sealing material and the like.

Figure 18F:
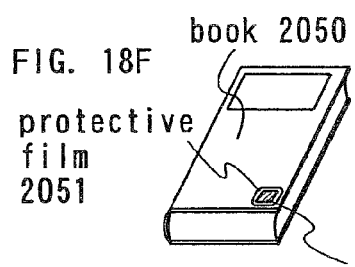

FIG. 18F illustrates an ID chip 2052 incorporated in a book 2050. The invention is applied to a circuit in the ID chip 2052. With such a structure, distribution management at a bookstore, circulation management at a library, and the like can be simplified. In FIG. 18F, a protective film 2051 is used for adhesion to prevent the ID chip 2052 from being detached, though the ID chip 2052 may be directly attached with an adhesive or incorporated in a book cover of the book 2050.

Figure 18G:
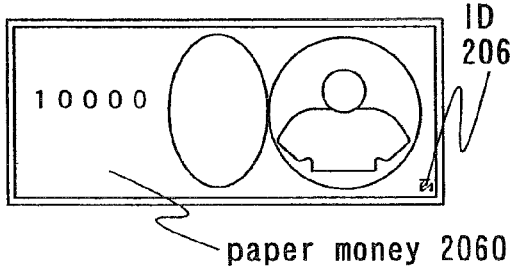

FIG. 18G illustrates an ID chip 2061 incorporated in a paper money 2060. The invention is applied to a circuit in the ID chip 2061. With such a structure, circulation of counterfeit paper money can be prevented easily. Note that the ID chip 2061 is preferably embedded in the paper money 2060 to prevent the ID chip 2061 from being detached due to the nature of paper money. The invention can be applied to an object made of a paper such as a valuable instrument and a passport as well as a paper money.

Figure 18H:
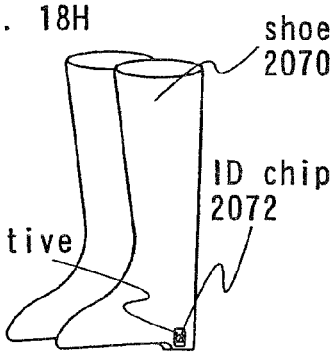

FIG. 18H illustrates an ID chip 2072 incorporated in a shoe 2070. The invention is applied to a circuit in the RFID chip 2072. With such a structure, identification of a manufacturer, distribution management, and the like of merchandise can be simplified. In FIG. 18H, a protective film 2071 is provided for adhesion to prevent the ID chip 2072 from being detached, though the ID chip 2022 may be directly attached with an adhesive or embedded in the shoe 2070. The invention can be applied to an object such as clothes and a bag as well as a shoe.

The case where an ID chip is set to various objects in order to protect the security thereof is described now. The security protection can be considered from the viewpoint of exclusion of theft or exclusion of counterfeit.

Figure 25:
FIG. 25 is a view illustrating a bag using the invention.

As an example of the exclusion of theft, the case where an ID chip is set to a bag is described. As shown in FIG. 25, an ID chip 2502 is set to a bag 2501. For example, the ID chip 2502 can be set at the bottom, the side, or the like of the bag 2501. The ID chip 2502 that is very thin and compact can be set without spoiling the design. Moreover, the ID chip 2502 has translucency, thus it is difficult for a stealer to judge whether the ID chip 2502 is set or not. Therefore, the ID chip 2502 is scarcely detached by the stealer.

When such a bag provided with an ID chip is stolen, information on a present position of the bag can be obtained by means of a GPS (Global Positioning System) and so on. Note that the GPS is a system to position depending on a time difference obtained from a signal received from a GPS satellite.

As for an object left behind or a dropped object in addition to such a stolen object, information on the present position can be obtained by means of a GPS.

An ID chip can be set to a vehicle such as an automobile and a bicycle, a timepiece, or an accessory as well as a bag.

As an example of the exclusion of counterfeit, the case where an ID chip is set to a passport, a certificate, or the like is described next.

Figure 26A:
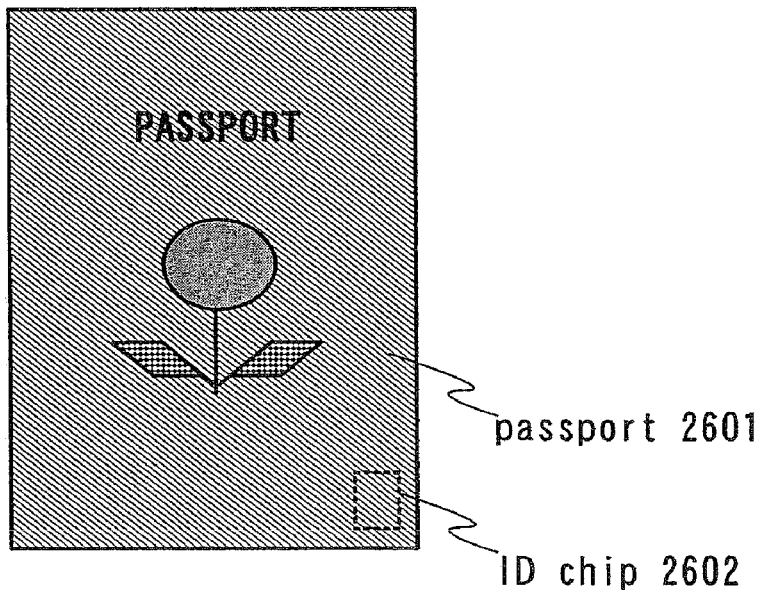
FIGS. 26A and 26B are views each illustrating a certificate using the invention.

FIG. 26A illustrates a passport 2601 with an ID chip. In FIG. 26A, an ID chip 2602 is set to a cover of the passport 2601, though it may be set to another page and may be set to a surface of the cover since the ID chip 2602 has translucency. Alternatively, the ID chip 2602 may be embedded in the cover so as to be sandwiched by a material for the cover and the like.

Figure 26B:
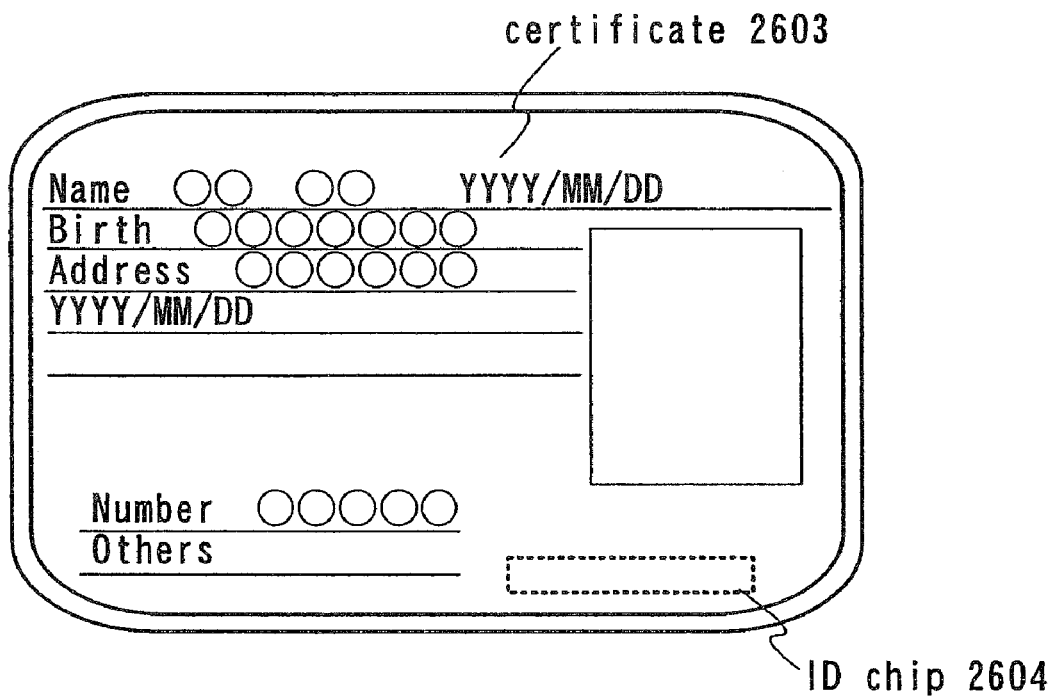

FIG. 26B illustrates a certificate 2603 with an ID chip. In FIG. 26B, an ID chip 2604 is embedded in the certificate 2603. The ID chip 2604 which has translucency may be set on a print side of the certificate 2603, for example, such that the ID chip 2604 is set on the print side of the certificate 2603 and covered with a laminate material. Alternatively, the ID chip 2604 may be embedded in the certificate 2603 so as to be sandwiched by a material for the certificate 2603.

By setting an ID chip to these objects, counterfeit thereof can be excluded. In addition, counterfeit of a bag is also excluded by setting an ID chip thereto. The ID chip that is very thin and compact can be set without spoiling the design of a passport, a certificate, and the like. Moreover, the ID chip has translucency, thus it may be set on the surface thereof.

In addition, according to the ID chip, supervision of the passport, the certificate, or the like can be simplified. Moreover, data can be stored in the ID chip without writing directly therein, thereby our privacy can be protected.

Figure 27:
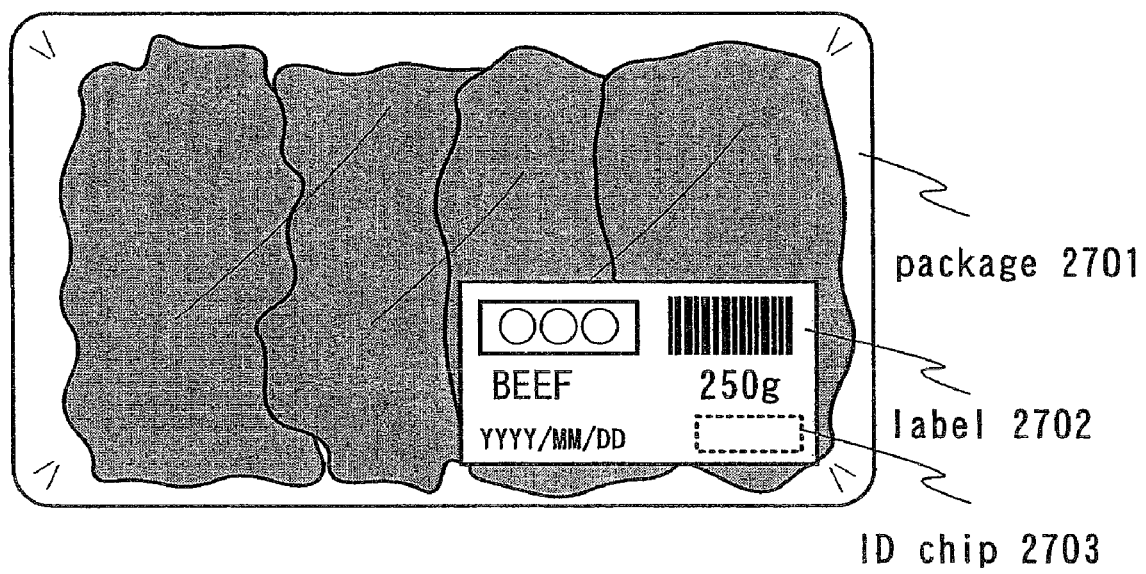
FIG. 27 is a view for describing grocery control using the invention.

The case where an ID chip is set to merchandise such as grocery for safety control is described using FIG. 27.

A label 2702 with an ID chip 2703 and a package for meat 2701 on which the label 2702 is attached are shown. The ID chip 2703 may be set on a surface of the label 2702 or embedded in the label 2702. Note that in the case of a fresh food such as vegetables, an ID chip may be set to a wrap for the fresh food.

The ID chip 2703 can store a basic point of the merchandise such as place of production, producer, pack date, and expiration date, and an applied point such as cooking example using the merchandise. The basic point that is not required to be rewritten is preferably stored in a memory which is not capable of being rewritten such as an MROM. The applied point is preferably stored in a memory which is capable of being rewritten and cleared such as an EEROM.

In addition, for safety control of a grocery, it is important that states of pre-processed plants and animals can be obtained. In view of this, an ID chip may be preferably embedded in the plants and animals so that data thereon is obtained by a reader device. The data on plants and animals includes breeding place, feed, breeder, and whether any contagion infects it or not.

In addition, in the case where an ID chip stores price of the merchandise, checking out can be carried out more simply in a shorter time compared to the case where a barcode is used as conventional. That is, plural pieces of merchandise with ID chips can be checked out all at once. In the case where a plurality of ID chips are read out in this manner, the reader device is required to be provided with an anti collision function.

Moreover, the checking out of merchandise is possible even when a distance between a register and the merchandise is long, which depends on a communication distance of the ID chip. The ID chip can also serve to prevent shoplifting.

In addition, an ID chip can be used in combination with another information medium such as a barcode and a magnetic tape. For example, the basic point that is not required to be rewritten is stored in the ID chip while data to be renewed such as data on discounted price or special price is stored in the barcode, because the barcode can easily revise unlike the ID chip.

By setting an ID chip as described above, the volume of data for a consumer can be increased, so that the consumer can purchase the merchandise without anxiety.

Figure 28A:
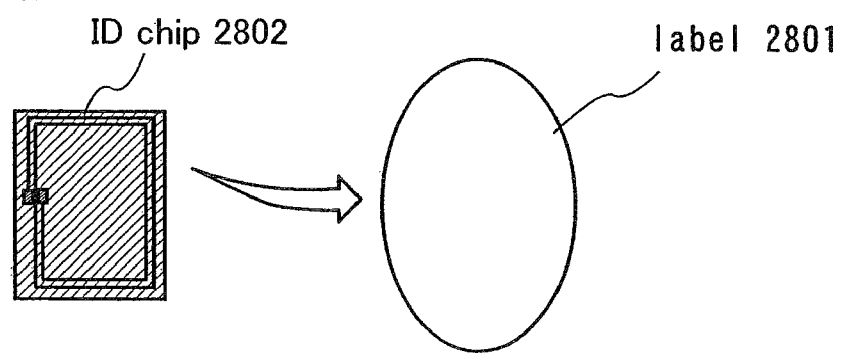
FIGS. 28A and 28B are views for describing physical distribution management using the invention.
Figure 28B:
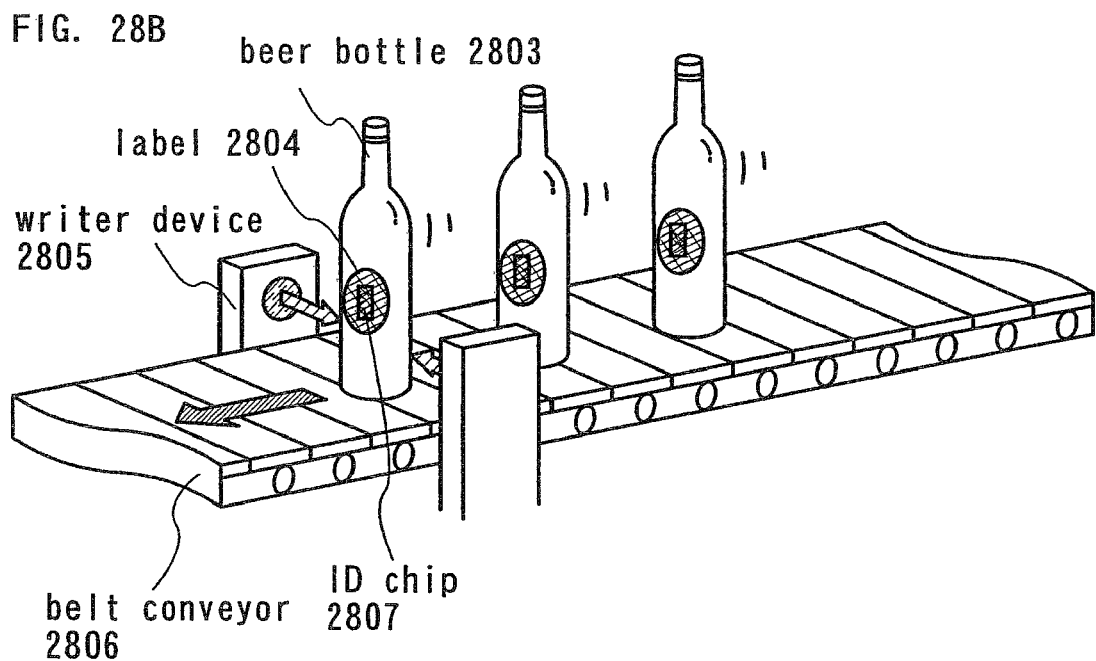

The case where an ID chip is set to merchandise such as a beer bottle for physical distribution management is described below. As shown in FIG. 28A, an ID chip 2802 is set to a beer bottle. For example, the ID chip 2802 may be attached by means of a label 2801.

The ID chip stores a basic point such as date manufactured, manufacturing place, and material thereof. Such a basic point is not required to be rewritten, thus it is preferably stored in a memory which is not capable of being rewritten such as an MROM. In addition, the ID chip stores an individual point such as address, date and time for delivery of the beer bottle. For example, the address and the date and time for delivery can be stored in an ID chip 2807 in a label 2804 when a beer bottle 2803 passes through a writer device 2805 with a flow of a belt conveyor 2806. Such an individual point can be preferably stored in a memory which is capable of being rewritten and cleared such as an EEROM.

In addition, a system may be preferably built such that when data on the merchandise purchased is sent from a shop to a physical distribution management center through network, a writer device, or a personal computer or the like for controlling the writer device calculates address, and date and time for delivery to store in the ID chip.

Note that a beer bottle is delivered per case. In view of this, it is possible that an ID chip is set per case or per a plurality of cases to store an individual point.

As for a something to drink to which a plurality of addresses for delivery may be stored, by setting an ID chip, time required for inputting manually can be suppressed, thereby input miss due to the manual procedures can be reduced. In addition to this, manpower cost that is the most expensive in the field of the physical distribution management can be reduced. Accordingly, the setting of an ID chip enables physical distribution management with less miss at low cost.

In addition, an applied point such as grocery matched with a beer and a recipe using beer can be recorded by a receiver Consequently, advertisement of the grocery and the like is carried out at the same time, which drives the consumers to buy. Such an applied point can be preferably stored in a memory which is capable of being rewritten and cleared such as an EEROM. By setting an ID chip as described above, the volume of data for a consumer can be increased, so that the consumer can purchase the merchandise without anxiety.

An article of manufacture with an ID chip and a manufacturing apparatus (a manufacturing robot) controlled based on data of the ID chip for manufacturing control are described below.

Nowadays, original merchandise is produced in many cases, where a manufacture line manufactures them in accordance with original data of the merchandise. For example, in a manufacture line of an automobile in which a painting color of a door can be selected appropriately, an ID chip is set at an automobile and painting apparatus is controlled based on data from the ID chip. Accordingly, an original automobile can be manufactured.

According by setting an ID chip thereto, the sequence of automobiles to be pumped into the manufacture line and the number of automobiles to have the same color are not required to be controlled in advance. Correspondingly, any program for controlling the sequence and the number of automobiles, and the painting apparatus so as to correspond to them is not required to be set. That is, the manufacturing apparatus can operate individually based on data of the ID chip that is set to each the automobile.

As described hereinbefore, an ID chip can be used in various places. Individual data on manufacture can be obtained from data stored in the ID chip so that a manufacturing device can be controlled based on the data.

Figure 29:
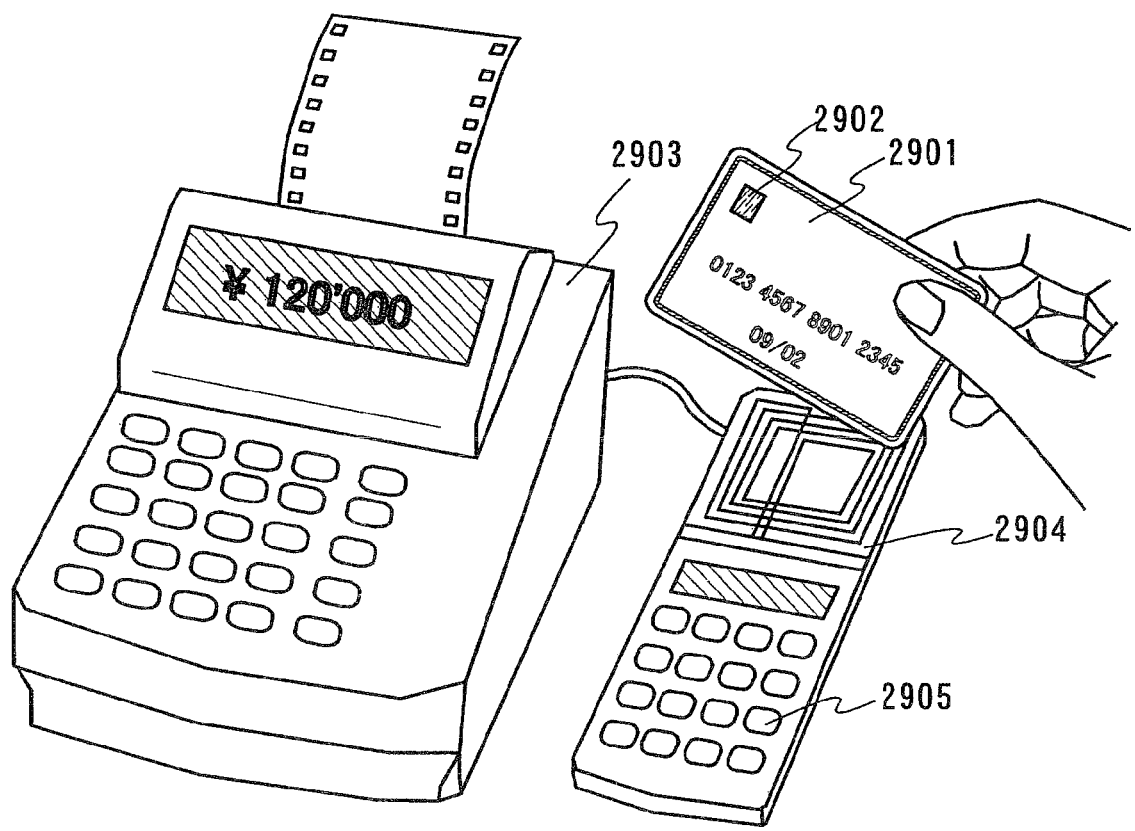
FIG. 29 is a view for describing IC card settlement using the invention.

Described next is the case where an IC card using an ID chip of the invention is utilized as electronic money. In FIG. 29, settlement is carried out by using an IC card 2901. The IC card 2901 has an ID chip 2902 of the invention. In utilizing the IC card 2901, a register 2903 and a reader/writer 2904 are used. The sum of money of the IC card 2901 is stored in the ID chip 2902, and the data on the sum can be read by a non-contact means by the reader/writer 2904 to be sent to the register 2903. The register 2903 makes certain that the sum of money of the IC card 2901 is larger than the settlement amount to carry out the settlement. Then, data on remains of the IC card 2901 is sent to the reader/writer 2904. The reader/writer 2904 can write the data on remains into the ID chip 2902 of the IC card 2901.

The reader/writer 2904 may be provided with a key 2905 for inputting a password so that unauthorized settlement using the IC card 2901 by a third party can be restricted.

Note that this embodiment describes only one example and the invention is not limited to these applications.

As described hereinbefore, an application range of the invention is so wide that the invention can be applied as a chip for individual identification for various objects. This embodiment can be implemented in combination with any one of the structures of the above-described embodiment mode and embodiments.

What is claimed is:

1. A semiconductor device, over an insulating substrate, comprising:
   a modulating circuit;
   a demodulating circuit;
   a logic circuit, wherein the demodulating circuit is operationally connected to the logic circuit;
   a voltage boosting power source circuit;
   a fuse memory circuit comprising a thin film transistor and a fuse element wherein the fuse memory circuit has a function of storing an output signal of the logic circuit; and an antenna circuit, wherein the voltage boosting power source circuit, the modulating circuit, and the demodulating circuit are electrically connected to the antenna circuit, wherein the voltage boosting power source circuit is electrically connected to the fuse memory circuit, and wherein at least one of the modulating circuit, the demodulating circuit, and the logic circuit comprises a thin film transistor.

2. The semiconductor device according to claim 1, wherein the fuse memory circuit comprises a control circuit for writing data only one time.

3. The semiconductor device according to claim 1, wherein the fuse element carries out a storage operation by blowing a metal wiring.

4. The semiconductor device according to claim 1, wherein a power for carrying out a storage operation by the fuse memory circuit is obtained by rectifying a signal output from the antenna circuit and boosting a voltage of the signal output from the antenna circuit.

5. The semiconductor device according to claim 1, wherein a power for carrying out a storage operation by the fuse memory circuit is obtained with an external high voltage power source.

6. The semiconductor device according to claim 1, wherein the antenna circuit, the modulating circuit, the demodulating circuit, the logic circuit, and the fuse memory circuit are integrally formed over the same insulating substrate.

7. The semiconductor device according to claim 1, wherein the modulating circuit, the demodulating circuit, the logic circuit, and the fuse memory circuit are integrally formed over the same insulating substrate and the antenna circuit is formed over another insulating substrate.

8. The semiconductor device according to claim 1, wherein the antenna circuit is formed over at least one of the modulating circuit, the demodulating circuit, the logic circuit, and the fuse memory circuit.

9. The semiconductor device according to claim 1, wherein a signal input to the antenna circuit is a radio frequency signal.

10. An IC card, an IC tag, an RFID, a transponder, a paper money, a valuable instrument, a passport, electronic equipment, a bag, and clothing each comprising the semiconductor device according to claim 1.

11. A semiconductor device, over an insulating substrate, comprising:
    a modulating circuit;
    a demodulating circuit;
    a logic circuit, wherein the demodulating circuit is operationally connected to the logic circuit;
    a rectifier circuit;
    a stabilizing power circuit being electrically connected to the rectifier circuit;
    a voltage boosting power source circuit being electrically connected to the stabilizing power circuit;
    a fuse memory circuit comprising a thin film transistor and a fuse element wherein the fuse memory circuit has a function of storing an output signal of the logic circuit; and
    an antenna circuit, wherein the rectifier circuit, the modulating circuit, and the demodulating circuit are electrically connected to the antenna circuit,
    wherein the voltage boosting power source circuit is electrically connected to the fuse memory circuit, and
    wherein at least one of the modulating circuit, the demodulating circuit, and the logic circuit comprises a thin film transistor.

12. The semiconductor device according to claim 11, wherein the fuse element carries out a storage operation by blowing a metal wiring.

13. The semiconductor device according to claim 11, wherein a power for carrying out a storage operation by the fuse memory circuit is obtained by rectifying a signal output from the antenna circuit and boosting a voltage of the signal output from the antenna circuit.

14. The semiconductor device according to claim 11, wherein a power for carrying out a storage operation by the fuse memory circuit is obtained with an external high voltage power source.

15. The semiconductor device according to claim 11, wherein the antenna circuit, the modulating circuit, the demodulating circuit, the logic circuit, and the fuse memory circuit are integrally formed over the same insulating substrate.

16. The semiconductor device according to claim 11, wherein the modulating circuit, the demodulating circuit, the logic circuit, and the fuse memory circuit are integrally formed over the same insulating substrate and the antenna circuit is formed over another insulating substrate.

17. The semiconductor device according to claim 11, wherein the antenna circuit is formed over at least one of the modulating circuit, the demodulating circuit, the logic circuit, and the fuse memory circuit.

18. The semiconductor device according to claim 11, wherein a signal input to the antenna circuit is a radio frequency signal.

19. An IC card, an IC tag, an RFID, a transponder, a paper money, a valuable instrument, a passport, electronic equipment, a bag, and clothing each comprising the semiconductor device according to claim 11.

* * * * *